United States Patent
Hata et al.

(10) Patent No.: US 9,611,985 B2
(45) Date of Patent: Apr. 4, 2017

(54) LIGHT EMITTING DEVICE, LIGHTING DEVICE

(75) Inventors: Toshio Hata, Osaka (JP); Makoto Agatani, Osaka (JP); Toyonori Uemura, Osaka (JP); Shinya Ishizaki, Osaka (JP); Hitoshi Matsushita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 185 days.

(21) Appl. No.: 14/118,885

(22) PCT Filed: Mar. 22, 2012

(86) PCT No.: PCT/JP2012/057402
§ 371 (c)(1),
(2), (4) Date: Nov. 19, 2013

(87) PCT Pub. No.: WO2012/165007
PCT Pub. Date: Dec. 6, 2012

(65) Prior Publication Data
US 2014/0098529 A1    Apr. 10, 2014

(30) Foreign Application Priority Data

May 27, 2011 (JP) .................................. 2011-119778
Jul. 5, 2011 (JP) .................................. 2011-149425

(51) Int. Cl.
*F21K 99/00* (2016.01)
*F21V 23/00* (2015.01)
(Continued)

(52) U.S. Cl.
CPC .............. *F21K 9/50* (2013.01); *F21V 23/001* (2013.01); *H05K 1/0274* (2013.01); *H05K 1/11* (2013.01);
(Continued)

(58) Field of Classification Search
CPC .......................... H05K 1/0274; F21V 23/001
See application file for complete search history.

(56) References Cited

U.S. PATENT DOCUMENTS 6,686,691 B1   2/2004   Mueller et al.
2003/0067775 A1   4/2003   Nagai et al.
(Continued)

FOREIGN PATENT DOCUMENTS

CN   101257012 A   9/2008
JP   10-39793   2/1998
(Continued)

OTHER PUBLICATIONS

Supplementary EP Search Report mailed Oct. 14, 2014 in EP Application 12792316.7.
(Continued)

*Primary Examiner* — Elmito Breval
(74) *Attorney, Agent, or Firm* — Nixon & Vanderhye P.C.

(57) ABSTRACT

The light-emitting device (100) includes a substrate (101) and a plurality of light-emitting sections. A first light-emitting section is made up of LED chips (102) and a first fluorescent-substance-containing resin layer (107), and a second light-emitting section is made up of LED chips (102) and a second fluorescent-substance-containing resin layer (108). The first fluorescent-substance-containing resin layer (107) and the second fluorescent-substance-containing resin layer (108) are provided in a plurality of locations such that the fluorescent-substance-containing resin layers for the different light-emitting sections are adjacently arranged.

17 Claims, 34 Drawing Sheets

(51) Int. Cl.
*H05K 1/02* (2006.01)
*H05K 1/11* (2006.01)
*H01L 25/075* (2006.01)
*H01L 33/50* (2010.01)
*F21V 3/00* (2015.01)
*H05K 3/28* (2006.01)
*F21Y 101/00* (2016.01)
*F21K 9/232* (2016.01)

(52) U.S. Cl.
CPC ............... *F21K 9/232* (2016.08); *F21V 3/00* (2013.01); *F21Y 2101/00* (2013.01); *H01L 25/0753* (2013.01); *H01L 33/508* (2013.01); *H01L 2224/48137* (2013.01); *H01L 2924/3025* (2013.01); *H05K 3/28* (2013.01); *H05K 2201/09909* (2013.01); *H05K 2201/10106* (2013.01); *H05K 2203/049* (2013.01)

(56) References Cited

U.S. PATENT DOCUMENTS

| | | | |
|---|---|---|---|
| 2005/0040762 A1* | 2/2005 | Kurihara | H01L 51/5237 313/512 |
| 2006/0065957 A1 | 3/2006 | Hanya | |
| 2009/0050908 A1* | 2/2009 | Yuan | F21K 9/00 257/88 |
| 2010/0134043 A1 | 6/2010 | Kadotani et al. | |
| 2010/0270581 A1 | 10/2010 | Umakoshi | |
| 2010/0320483 A1* | 12/2010 | Kadotani | F21K 9/00 257/88 |
| 2011/0050071 A1 | 3/2011 | Chung et al. | |
| 2011/0116252 A1* | 5/2011 | Agatani | F21K 9/00 362/84 |

FOREIGN PATENT DOCUMENTS

| | | |
|---|---|---|
| JP | 2002-60747 | 2/2002 |
| JP | 2003-100108 | 4/2003 |
| JP | 2004-356116 | 12/2004 |
| JP | 2006-80334 | 3/2006 |
| JP | 2006-93435 A | 4/2006 |
| JP | 2008-218485 A | 9/2008 |
| JP | 2008-218486 | 9/2008 |
| JP | 2008-235680 | 10/2008 |
| JP | 2010-73627 | 4/2010 |
| JP | 2010-129583 A | 6/2010 |
| JP | 2011-044499 A | 3/2011 |
| JP | 2011-49516 | 3/2011 |
| JP | 2011-71221 | 4/2011 |
| JP | 2012-142428 A | 7/2012 |
| WO | WO 2010/013893 | 2/2010 |

OTHER PUBLICATIONS

International Search Report for PCT/JP2012/057402, mailed Apr. 24, 2012.
Foreign-language Written Opinion of the International Searching Authority for PCT/JP2012/057402, mailed Apr. 24, 2012.
Japanese Office Action mailed Jan. 12, 2016 in JP Patent Application 2015-054182.
Japanese Office Action mailed Jun. 28, 2016 in Japanese application 2015-054183.

* cited by examiner

F I G. 7
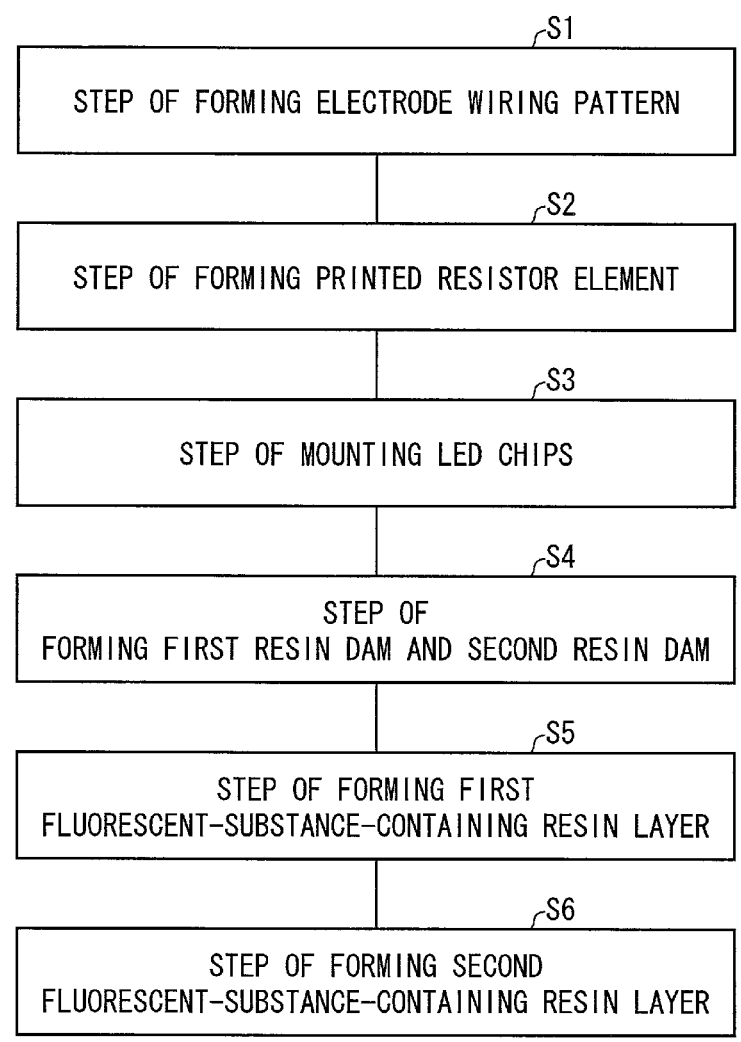

F I G. 9
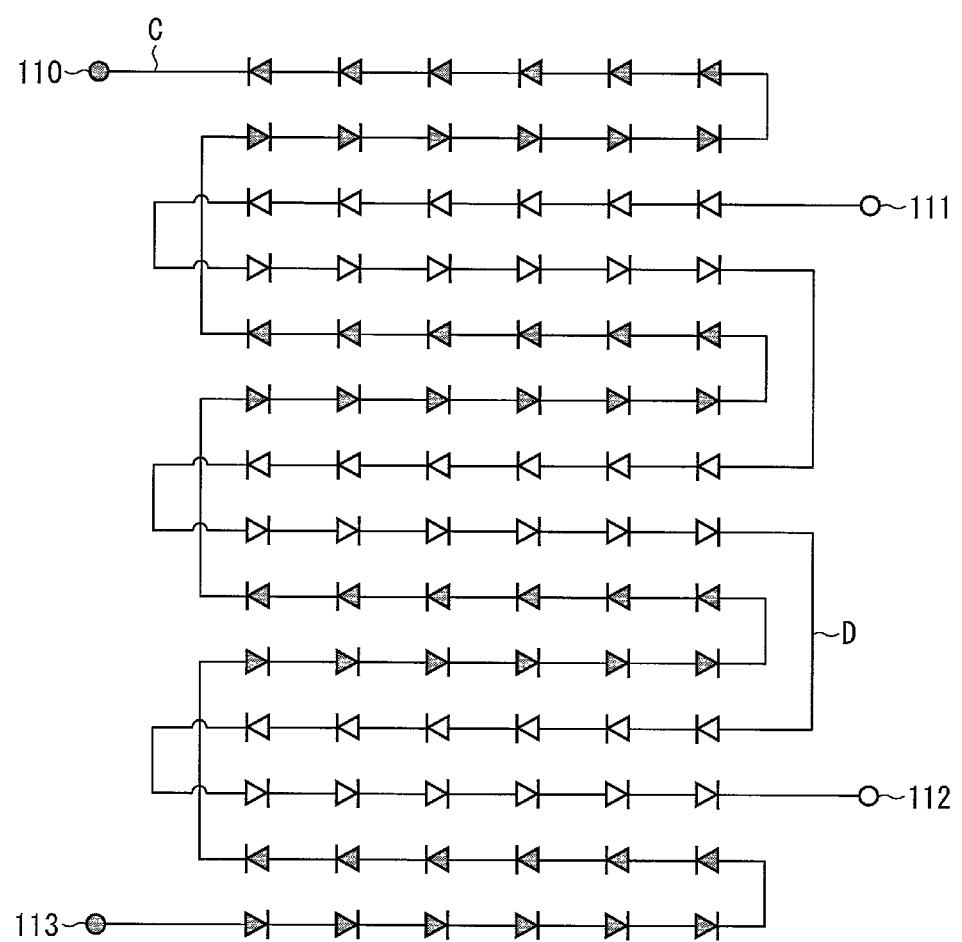

F I G. 1 1
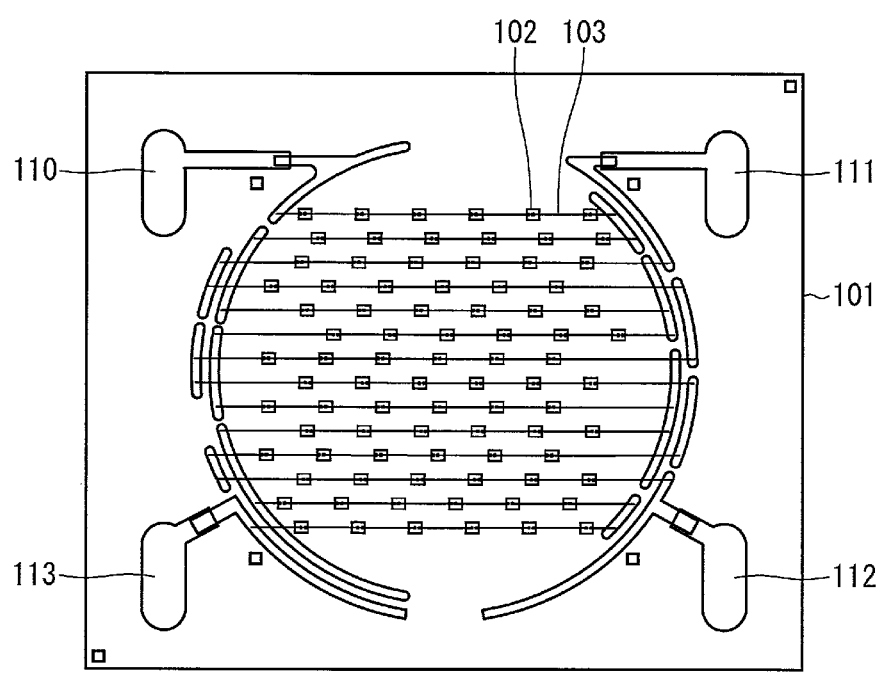

105

F I G. 1 3
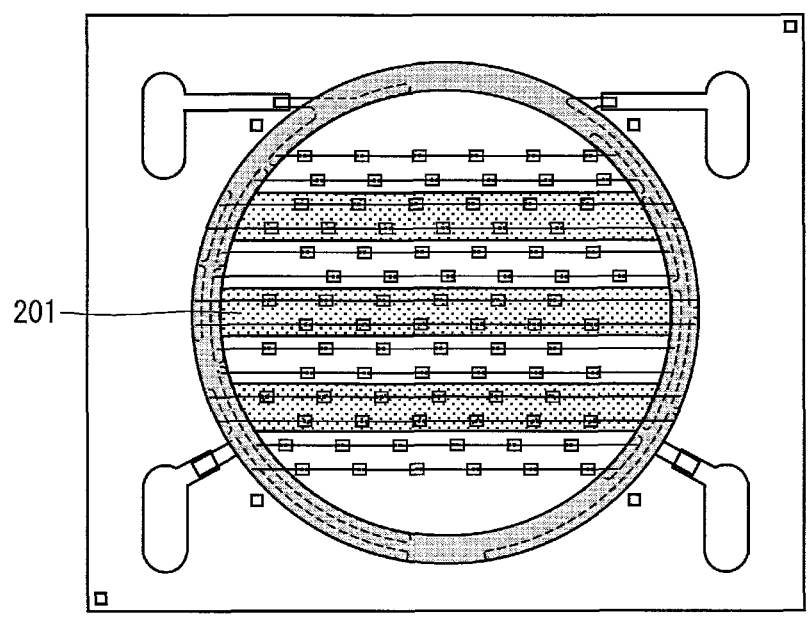

F I G. 2 3
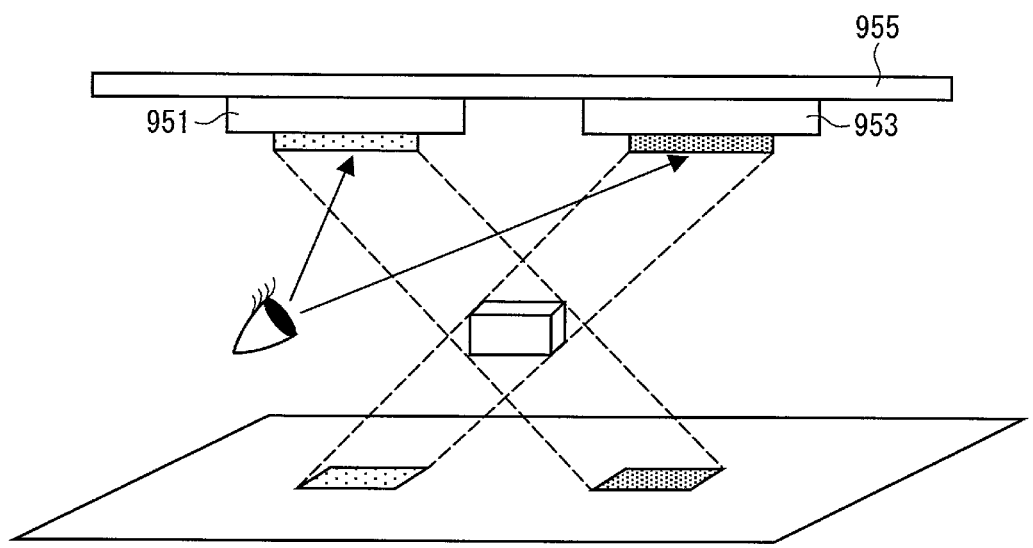

F I G. 3 3
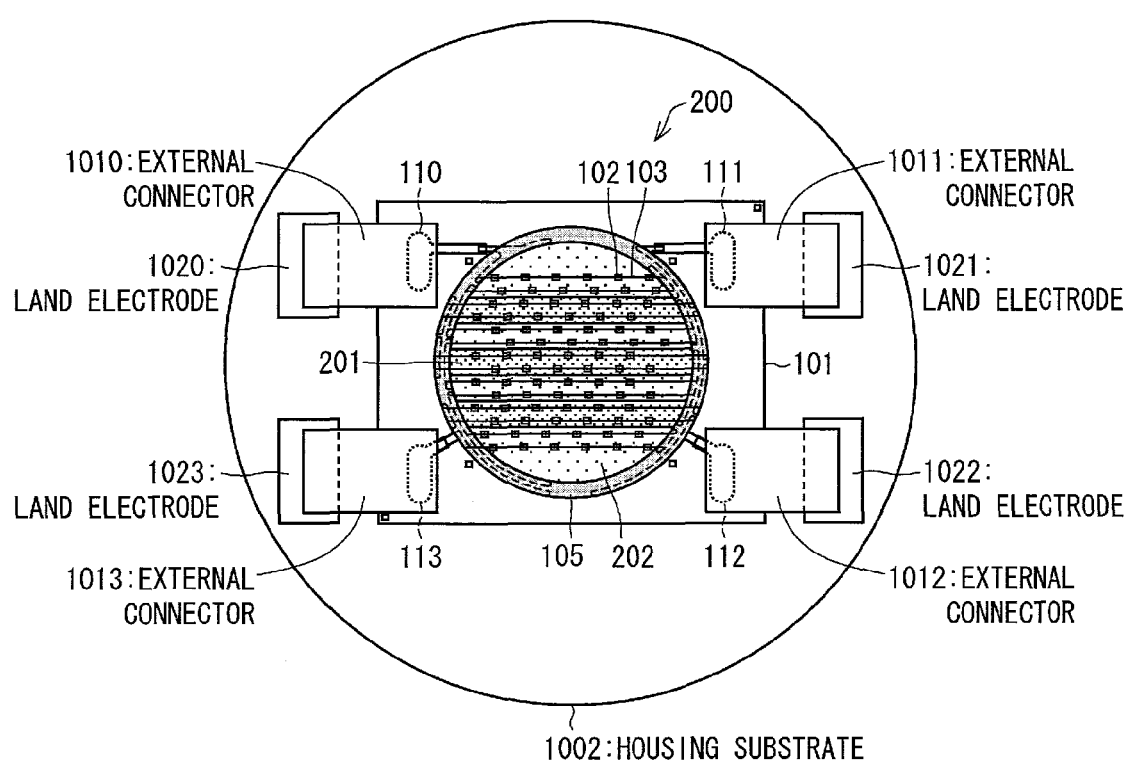

F I G. 3 5
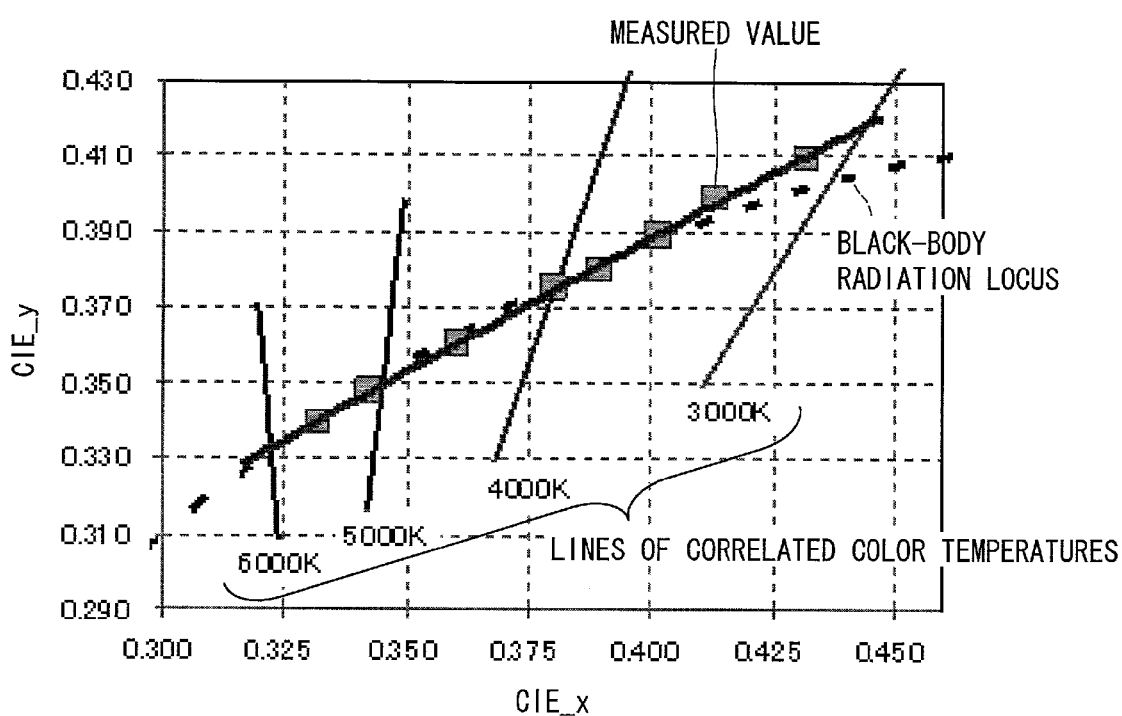

F I G. 3 6
| LIGHT BULB COLOR (2700K) | INTERMEDIATE COLOR (3800K) | DAYLIGHT COLOR (5700K) |
|---|---|---|
| 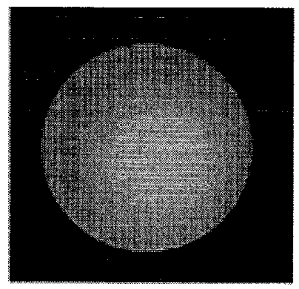 | 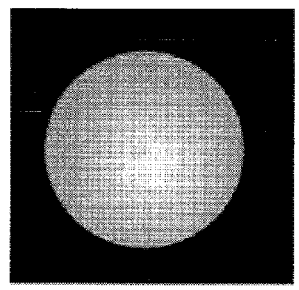 | 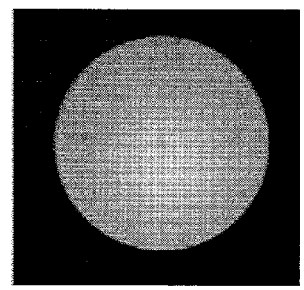 |

US 9,611,985 B2

LIGHT EMITTING DEVICE, LIGHTING DEVICE

This application is the U.S. national phase of International Application No. PCT/JP2012/057402, filed 22 Mar. 2012, which designated the U.S. and claims priority to JP Application No. 2011-119778, filed 27 May 2011; and JP Application No. 2011-149425, filed 5 Jul. 2011, the entire contents of each of which are hereby incorporated by reference.

TECHNICAL FIELD

The present invention relates to a light-emitting device including an LED (Light Emitting Diode), a lighting device, and a method for manufacturing the light-emitting device. In particular, the present invention relates to a technique to generate white light which is remarkably excellent in color rendering property and in mixed color performance.

BACKGROUND ART

In recent years, as environmental measures against global warming, LEDs have rapidly been used as light sources of general lighting apparatuses and as light sources of backlights provided in TVs. Such a light source is configured by an LED lighting module (light-emitting device) that is configured to emit white light. Examples of a method for generating white light with the use of an LED encompass (i) a method in which white light is generated by combining the three primary colors of light with the use of three LEDs, i.e., a red LED, a blue LED, and a green LED and (ii) a method in which white light is generated by mixing blue light and yellow light by using a blue LED as a light source for a yellow fluorescent substance. Further, some techniques have been proposed to generate white light whose color can be adjusted and which is excellent in color rendering property and in reproducibility (for example, see Patent Literatures 1 through 4).

However, according to the conventional techniques, a degree of integration of a plurality of LED devices cannot be increased because of a restriction such as a size of packaged components, and accordingly a spatial mixed color performance is low. This causes a problem that the plurality of LED devices are more likely to emit respective bright spot lights, and therefore color unevenness easily occurs. The following description will discuss this problem with reference to FIG. 23.

FIG. 23 illustrates how colors are mixed in a case where an LED device 951 which emits light of a color A and an LED device 953 which emits light of a color B are both provided on a single substrate 955. In this case, when the light sources are directly viewed, the light sources are separately viewed as two light-emitting points of different colors. Further, a spatial mixed color performance of the light of color A and the light of color B is low. This causes the LED devices more likely to emit respective bright spot lights, and therefore color unevenness easily occurs (e.g., shadows of an object become different colors). Note that this problem occurs even in a case where the LED device 951 and the LED device 953 emit lights of identical colors.

In view of this, a technique has been proposed in which a spatial mixed color performance is improved by adjacently arranging the LED devices 951 and 953 (for example, see Patent Literature 5).

CITATION LIST

Patent Literature

[Patent Literature 1]
Japanese Patent Application Publication Tokukai No. 2002-60747 A (Publication date: Feb. 26, 2002)

[Patent Literature 2]
Japanese Patent Application Publication Tokukai No. 2003-100108 A (Publication date: Apr. 4, 2003)

[Patent Literature 3]
Japanese Patent Application Publication Tokukai No. 2004-356116 A (Publication date: Dec. 16, 2004)

[Patent Literature 4]
Japanese Patent Application Publication Tokukai No. 2006-80334 A (Publication date: Mar. 23, 2006)

[Patent Literature 5]
Japanese Patent Application Publication Tokukai No. 2011-49516 A (Publication date: Mar. 10, 2011)

SUMMARY OF INVENTION

Technical Problem

However, according to the configuration disclosed in Patent Literature 5, the LED devices are simply adjacently arranged. Therefore, the problem of emitting bright spot lights still remains. Under the circumstances, a level of inhibiting color unevenness is not sufficient, and a recently demanded level cannot be achieved.

The present invention is accomplished in view of the conventional problems, and its object is to provide (i) a light-emitting device and a lighting device which can easily emit light (a) which is higher in mixed color performance, (b) whose color can be adjusted easily, and (c) which has a high color rendering properly and (ii) a method for manufacturing such a light-emitting device.

Solution to Problem

In order to attain the object, a light-emitting device of the present invention includes: a substrate; and a plurality of light-emitting sections which are adjacently provided on an upper surface of the substrate, each of the plurality of light-emitting sections being made up of (i) a plurality of light-emitting elements which are electrically connected with each other and (ii) a resin layer which seals the plurality of light-emitting elements, the plurality of light-emitting sections being driven separately, at least one color of light, which is emitted from any one of the plurality of light-emitting sections, being different from at least one color of light which is emitted from at least another one of the plurality of light-emitting sections, in a cross section of the light-emitting device, each of the resin layers of the respective plurality of light-emitting sections being arranged in a plurality of locations each of which is arranged to be adjacent to a location in which any of the other resin layers is arranged, the cross section being perpendicular to the upper surface of the substrate and passing through a reference point which is, when viewed in a direction perpendicular to the upper surface, a center of an area of the upper surface in which area the plurality of light-emitting sections are formed.

According to the configuration, each of the plurality of light-emitting sections is not formed in an agglomerated shape but is formed so that a certain one of the plurality of light-emitting sections is entangled in another one of the plurality of light-emitting sections. This allows equivalent light-distribution characteristics to be closely entangled with each other, and it is therefore possible (i) to easily mix colors when the plurality of light-emitting sections are simultaneously turned on and accordingly (ii) to obtain a remarkably good mixed color. Moreover, since the plurality of light-emitting sections are arranged close to each other, identical thermal influence is to be exerted on the plurality of light-emitting sections. This allows a brightness and a color tone of the generated light to be hardly influenced by heat and a change with time. Moreover, it is possible to reduce a variation in peak wavelength and a large variation in color rendering property.

Since the plurality of light-emitting sections can be separately driven, it is possible to turn on only one of the plurality of light-emitting sections or to separately turn on the plurality of light-emitting sections. Further, it is possible to easily adjust light, (i) whose color is obtained by mixing colors of lights emitted from the respective plurality of light-emitting sections and (ii) which is emitted as light from the entire light-emitting device, to have an intended chromaticity by adjusting lighting conditions (i.e., light emission intensities) of the respective plurality of light-emitting sections.

Moreover, at least one color of light, which is emitted from any one of the plurality of light-emitting sections, is configured to be different from at least one color of light which is emitted from at least another one of the plurality of light-emitting sections. This makes it possible to obtain light whose color is obtained by mixing at least two colors. As such, it is possible to easily adjust a chromaticity of light emitted by the entire light-emitting device. This makes it possible to easily obtain a high color rendering property, depending on a combination of colors of lights emitted from the plurality of light-emitting sections.

Therefore, according to the light-emitting device, it is possible to obtain a higher mixed color performance, and it is also possible to easily emit light whose color can be easily adjusted and which has a high color rendering properly.

A lighting device of the present invention includes the light-emitting device as a light source.

According to the configuration, the light-emitting device is provided as the light source, and therefore the remarkably excellent lighting device can be achieved. Moreover, since the light-emitting device includes the light-emitting element, it is possible to achieve energy saving, space saving, and a long life.

A lighting device manufacturing method of the present invention is a method for manufacturing a light-emitting device including a substrate and a plurality of light-emitting sections which are adjacently provided on an upper surface of the substrate, each of the plurality of light-emitting sections being made up of (i) a plurality of light-emitting elements which are electrically connected with each other and (ii) a resin layer which seals the plurality of light-emitting elements, the plurality of light-emitting sections being driven separately, and at least one color of light, which is emitted from any one of the plurality of light-emitting sections, being different from at least one color of light which is emitted from at least another one of the plurality of light-emitting sections, the method including the steps of: (a) mounting the plurality of light-emitting elements of each of the plurality of light-emitting sections on the upper surface of the substrate so that the plurality of light-emitting elements are electrically connected with each other; and (b) forming the resin layers of the respective plurality of light-emitting sections sequentially by sealing the plurality of light-emitting elements, which have been mounted on the upper surface, by a resin in each of the plurality of light-emitting sections, in the step (a), the plurality of light-emitting elements of each of the plurality of light-emitting sections being arranged and electrically connected with each other such that, in a cross section of the light-emitting device, each of the resin layers of the respective plurality of light-emitting sections, which are formed in the step (b), are arranged in a plurality of locations each of which is arranged to be adjacent to a location in which any of the other resin layers is arranged, the cross section being perpendicular to the upper surface of the substrate and passing through a reference point which is, when viewed in a direction perpendicular to the upper surface, a center of an area of the upper surface in which area the plurality of light-emitting sections are formed.

According to the configuration, each of the plurality of light-emitting sections is not formed in an agglomerated shape but is formed so that a certain one of the plurality of light-emitting sections is entangled in another one of the plurality of light-emitting sections. This allows equivalent light-distribution characteristics to be closely entangled with each other, and it is therefore possible (i) to easily mix colors when the plurality of light-emitting sections are simultaneously turned on and accordingly (ii) to obtain a remarkably good mixed color. Moreover, since the plurality of light-emitting sections are arranged close to each other, identical thermal influence is to be exerted on the plurality of light-emitting sections. This allows a brightness and a color tone of the generated light to be hardly influenced by heat and a change with time. Moreover, it is possible to reduce a variation in peak wavelength and a large variation in color rendering property.

Since the plurality of light-emitting sections can be separately driven, it is possible to turn on only one of the plurality of light-emitting sections or to separately turn on the plurality of light-emitting sections. Further, it is possible to easily adjust light, (i) whose color is obtained by mixing colors of lights emitted from the respective plurality of light-emitting sections and (ii) which is emitted as light from the entire light-emitting device, to have an intended chromaticity by adjusting lighting conditions (i.e., light emission intensities) of the respective plurality of light-emitting sections.

Moreover, at least one color of light, which is emitted from any one of the plurality of light-emitting sections, is configured to be different from at least one color of light which is emitted from at least another one of the plurality of light-emitting sections. This makes it possible to obtain light whose color is obtained by mixing at least two colors. As such, it is possible to easily adjust a chromaticity of light emitted by the entire light-emitting device. This makes it possible to easily obtain a high color rendering property, depending on a combination of colors of lights emitted from the plurality of light-emitting sections.

Therefore, according to the light-emitting device manufacturing method, it is possible to provide the light-emitting device that can (i) obtain a higher mixed color performance and (ii) easily emit light whose color can be easily adjusted and which has a high color rendering properly.

Advantageous Effects of Invention

As above described, the light-emitting device of the present invention has the configuration in which each of the plurality of light-emitting sections is not formed in an agglomerated shape but is formed so that a certain one of the plurality of light-emitting sections is entangled in another one of the plurality of light-emitting sections (e.g., the plurality of light-emitting sections are formed in a spiral pattern or a striped pattern). It is therefore possible to obtain a higher mixed color performance, and it is also possible to easily emit light whose color can be easily adjusted and which has a high color rendering properly.

BRIEF DESCRIPTION OF DRAWINGS

FIG. 7 is a flowchart illustrating a flow of manufacturing the light-emitting device illustrated in FIG. 1.

FIG. 9 is a view illustrating a circuit configuration of LED chips in the light-emitting device illustrated in FIG. 8.

FIG. 11 is a plan view illustrating a configuration in which an LED chips are provided in manufacturing the light-emitting device illustrated in FIG. 8.

FIG. 13 is a plan view illustrating a configuration in which a first fluorescent-substance-containing resin layer is formed in manufacturing the light-emitting device illustrated in FIG. 8.

FIG. 23 is a view illustrating how colors are mixed in a case where two LED devices, which emit lights of different colors, are both provided on a single substrate.

FIG. 33 is a plan view of the LED light bulb.

FIG. 35 is a view illustrating a black-body radiation locus of the LED light bulb.

FIG. 36 is a view illustrating mixed colors of respective lights which are viewed through a globe in a case where color-control driving (2700K (light bulb color), 3800K (intermediate color), and 5700K (daylight color)) is carried out in accordance with FIG. 34.

DESCRIPTION OF EMBODIMENTS

Figure 1:
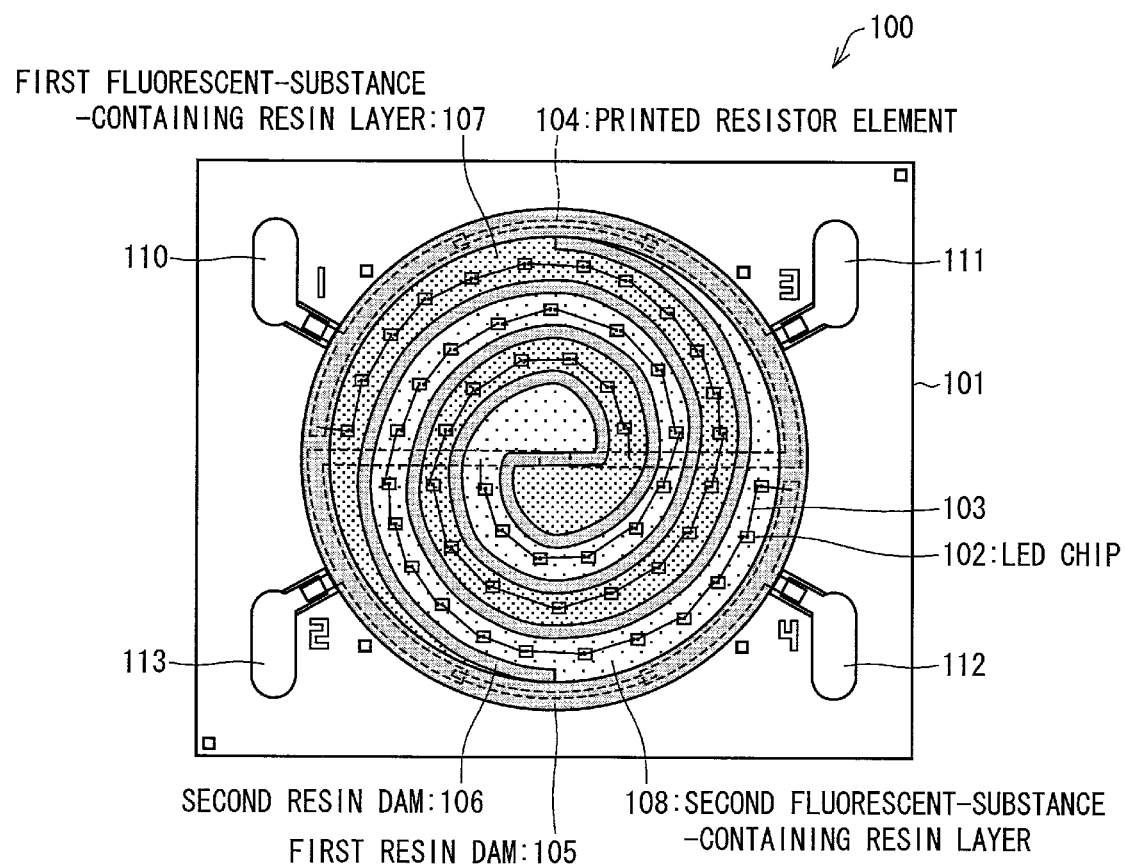
FIG. 1 is a plan view illustrating an example configuration of a light-emitting device in accordance with an embodiment of the present invention.

In embodiments of the present invention discussed below, a light-emitting device including an LED will be described with reference to drawings. Such a light-emitting device is provided as a light source in, for example, a lighting device such as a general lighting apparatus or a backlight of a TV, and a remarkably excellent lighting device can be thus provided. Moreover, the light-emitting device includes an LED, and it is therefore possible to achieve energy saving, space saving, and a long life.

Note that, in each of the embodiments, configurations which are not described in the embodiment are identical with those described in the followed embodiment(s). For convenience of explanation, in each of the embodiments described below, identical reference numerals are given to members which (i) are described in the followed embodiment with reference to drawings and (ii) have identical functions, and explanations of such members are not repeatedly described in the other embodiments.

Embodiment 1

Configuration of Light-Emitting Device

Figure 2:
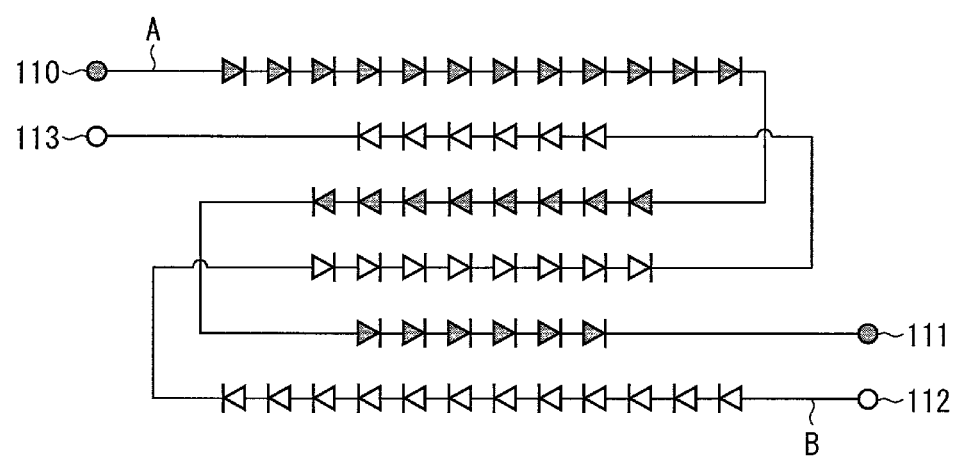
FIG. 2 is a view illustrating a circuit configuration of LED chips in the light-emitting device illustrated in FIG. 1.
Figure 3:
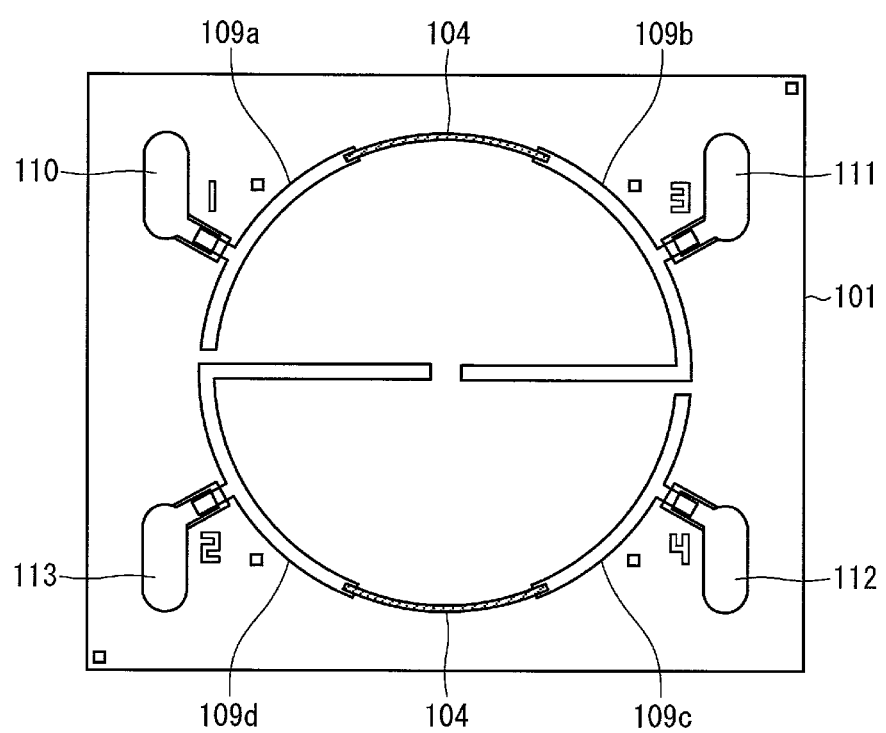
FIG. 3 is a plan view illustrating a configuration in which, in manufacturing the light-emitting device illustrated in FIG. 1, an electrode wiring pattern and a printed resistor element are formed on the substrate.
Figure 4:
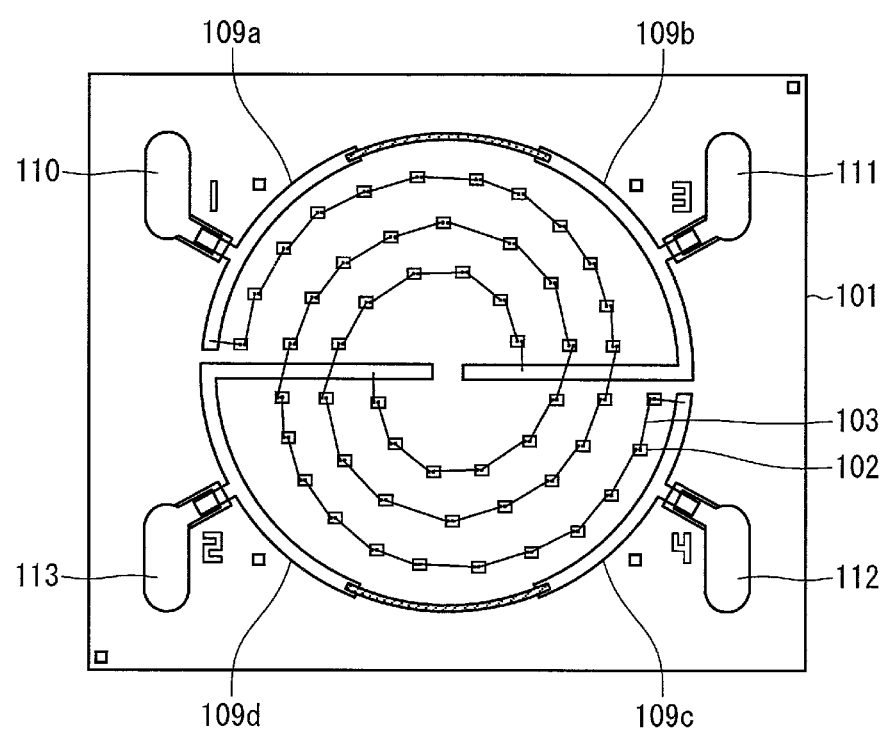
FIG. 4 is a plan view illustrating a configuration in which LED chips are provided in manufacturing the light-emitting device illustrated in FIG. 1.
Figure 5:
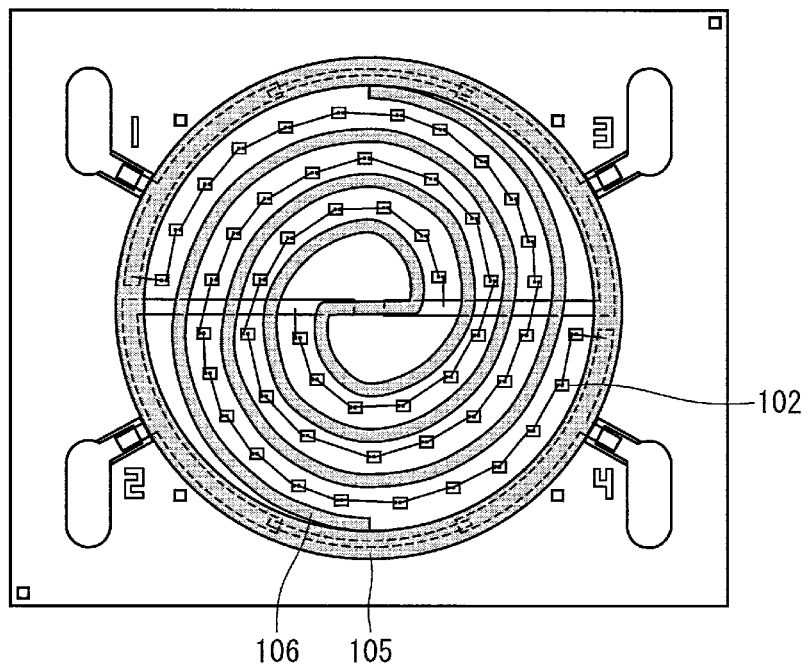
FIG. 5 is a plan view illustrating a configuration in which, in manufacturing the light-emitting device illustrated in FIG. 1, a first resin dam and a second resin dam are formed.
Figure 6:
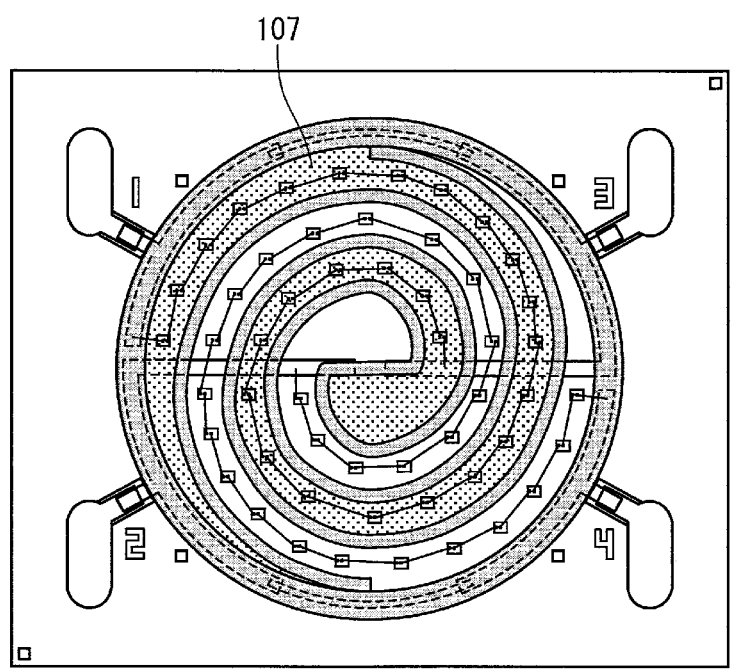
FIG. 6 is a plan view illustrating a configuration in which, in manufacturing the light-emitting device illustrated in FIG. 1, a first fluorescent-substance-containing resin layer is formed.

FIG. 1 is a plan view illustrating an example configuration of a light-emitting device 100 of Embodiment 1. FIG. 2 is a view illustrating a circuit configuration of LED chips 102 in the light-emitting device 100. FIGS. 3 through 6 are plan views each illustrating a configuration in manufacturing the light-emitting device 100. FIG. 3 illustrates a configuration in which an electrode wiring pattern and printed resistor elements 104 have been formed on a substrate 101. FIG. 4 illustrates a configuration in which the LED chips 102 have been mounted. FIG. 5 illustrates a configuration in which a first resin dam 105 and a second resin dam 106 have been formed. FIG. 6 illustrates a configuration in which a first fluorescent-substance-containing resin layer 107 has been formed.

The light-emitting device 100 includes a substrate 101, LED chips 102 (light-emitting element), printed resistor elements 104 (protection element), a first resin dam 105 (resin frame), a second resin dam 106 (resin partition), a first fluorescent-substance-containing resin layer 107 (resin layer), and a second fluorescent-substance-containing resin layer 108 (resin layer) (see FIG. 1).

Specifically, the light-emitting device 100 includes the plurality of LED chips 102 which are electrically connected with each other as illustrated in FIG. 2. The light-emitting device 100 includes two series circuit sections in each of which 26 LED chips 102 are connected in series with each other. The series circuit sections can be separately driven. Hereinafter, one of the two series circuit sections is referred to as "series circuit section A" and the other of the two series circuit sections is referred to as "series circuit section B".

The substrate 101 is a ceramic substrate made of ceramic. The substrate 101 has a rectangular shape in a plan view. On one surface (hereinafter, referred to as "upper surface") of the substrate 101, the LED chips 102, the printed resistor elements 104, the first resin dam 105, the second resin dam 106, the first fluorescent-substance-containing resin layer 107, and the second fluorescent-substance-containing resin layer 108 are provided. Further, a wiring line 109 for power supply and electrode lands 110 through 113 for external connection are formed on the upper surface of the substrate 101.

The wiring line 109 for power supply is formed in a pattern (i) in which the wiring line 109 for power supply is not located in an area inside the first resin dam 105 as much as possible and (ii) which is suitable for (a) electrically connecting the electrode lands 110 through 113 with the LED chips 102 and (b) being connected with the printed resistor elements 104. In this case, wiring lines 109a through 109d are formed as the wiring line 109.

The electrode land 110 serves as an anode electrode for the series circuit section A, and the electrode land 111 serves as a cathode electrode for the series circuit section A. The electrode land 110 is electrically connected with an LED chip 102, which is located in a highest electric potential part of the series circuit section A, via the wiring line 109a and a wire 103. The electrode land 111 is electrically connected with an LED chip 102, which is located in a lowest electric potential part of the series circuit section A, via the wiring line 109b and the wire 103.

The electrode land 112 serves as an anode electrode for the series circuit section B, and the electrode land 113 serves as a cathode electrode for the series circuit section B. The electrode land 112 is electrically connected with an LED chip 102, which is located in a highest electric potential part of the series circuit section B, via the wiring line 109c and the wire 103. The electrode land 113 is electrically connected with an LED chip 102, which is located in a lowest electric potential part of the series circuit section B, via the wiring line 109d and the wire 103.

Each of the electrode lands 110 through 113 has an oval shape in the plan view. The electrode lands 110 through 113 are located (i) in an area outside the first resin dam 105 and (ii) in the vicinity of respective four corners of the upper surface of the substrate 101. Surfaces of the respective electrode lands 110 through 113 are exposed so that the electrode lands 110 through 113 can be connected with respective external terminals.

The wiring line 109a is located (i) in the vicinity of the electrode land 110 and (ii) under the first resin dam 105. The wiring line 109a is covered with the first resin dam 105 and a part of the wiring line 109a extends so as to overlap with the electrode land 110.

The wiring line 109b is located (i) in the vicinity of the electrode land 111 and (ii) under the first resin dam 105. The wiring line 109b is covered with the first resin dam 105. Further, a part of the wiring line 109b extends toward a center of the upper surface of the substrate 101, and another part of the wiring line 109b extends so as to overlap with the electrode land 111.

The wiring line 109c is located (i) in the vicinity of the electrode land 112 and (ii) under the first resin dam 105. The wiring line 109c is covered with the first resin dam 105 and a part of the wiring line 109c extends so as to overlap with the electrode land 112.

The wiring line 109d is located (i) in the vicinity of the electrode land 113 and (ii) under the first resin dam 105. The wiring line 109d is covered with the first resin dam 105. Further, a part of the wiring line 109d extends toward a center of the upper surface of the substrate 101, and another part of the wiring line 109d extends so as to overlap with the electrode land 113.

The LED chip 102 is a blue LED whose emission peak wavelength is approximately 450 nm. Note, however, that the LED chip 102 is not limited to this and can be, for example, an ultraviolet (near-ultraviolet) LED chip whose emission peak wavelength is 390 nm to 420 nm. In this case, it is possible to further improve luminous efficiency.

The LED chips 102 are connected with each other via the wires 103, and the LED chips 102 are connected with the wiring line 109 via the wires 103 so that the series circuit sections A and B are formed. The series of LED chips 102 in the series circuit section A are arranged in a spiral pattern in the plan view. The series of LED chips 102 in the series circuit section B are arranged in a spiral pattern in the plan view such that the spiral of the series circuit section B runs (i) between lines of the spiral of the series circuit section A and (ii) in a direction identical with that of the spiral of the series circuit section A. The wires 103 are made of, for example, gold.

Two printed resistor elements 104 are provided in the light-emitting device 100. One of the two printed resistor elements 104 (i) is provided so as to overlap with a part of the wiring line 109a and with a part of the wiring line 109b and (ii) is therefore connected in parallel with the series circuit section A. The other of the two printed resistor elements 104 is provided so as to overlap with a part of the wiring line 109c and with a part of the wiring line 109d and is therefore connected in parallel with the series circuit section B. By thus employing the circuit configuration in which the printed resistor elements 104 are connected in parallel with the LED chips 102, it is possible to protect the LED chips 102 from a reverse voltage.

The printed resistor elements 104 are provided under the first resin dam 105 so as to be covered with the first resin dam 105. This makes it possible to inhibit the printed resistor elements 104 from absorbing light.

The first resin dam 105 and the second resin dam 106 define areas in which the first fluorescent-substance-containing resin layer 107 and the second fluorescent-substance-containing resin layer 108 are formed, respectively. The first resin dam 105 and the second resin dam 106 serve as dams (i.e., damming members) for preventing resin from leaking when the first fluorescent-substance-containing resin layer 107 and the second fluorescent-substance-containing resin layer 108 are formed.

The first resin dam 105 is provided so as to surround a predetermined area in which the LED chips 102 are to be mounted (i.e., an area that forms a plurality of light-emitting sections). In this case, the first resin dam 105 has an annular shape (i.e., ring shape) in the plan view.

The second resin dam 106 is provided so as to separate the area, which is surrounded by the first resin dam 105, into (i) an area in which the first fluorescent-substance-containing resin layer 107 is to be formed and (ii) an area in which the second fluorescent-substance-containing resin layer 108 is to be formed. In other words, the second resin dam 106 is provided so as to separate, without making contact with the LED chips 102, the area inside the first resin dam 105 into (i) an area in which the series of LED chips 102 of the series circuit section A are to be provided and (ii) an area in which the series of LED chips 102 of the series circuit section B are to be provided. In this case, the second resin dam 106 has a spiral shape in the plan view.

Each of the first resin dam 105 and the second resin dam 106 is made of a resin having a light reflecting property or a light blocking property. For example, each of the first resin dam 105 and the second resin dam 106 is made of a white silicone resin which contains (i) a light-transmitting silicone resin as a main component and (ii) titanium oxide $TiO_2$ as a light diffusion filler. In a case where the first resin dam 105 and the second resin dam 106 have the light reflecting property or the light blocking property, it is possible (i) to prevent the first resin dam 105 and the second resin dam 106 from absorbing light and accordingly (ii) to prevent a decrease in luminous efficiency. It is preferable that each of the first resin dam 105 and the second resin dam 106 contains at least any of a thickener and a diffusing agent.

Note, however, that the first resin dam 105 and the second resin dam 106 are not limited to the above materials, and each of the first resin dam 105 and the second resin dam 106 can be made of a material such as acrylic, urethane, epoxy, polyester, acrylonitrile butadiene styrene (ABS), or polycarbonate (PC) resin. The first resin dam 105 and the second resin dam 106 are colored in white. Note, however, that the color of the first resin dam 105 and the second resin dam 106 is not limited to this, and the color can be, for example, milk white. In a case where the resin is colored in white or milk white, it is possible to (i) lower optical transmittance of the resin or (ii) allow the resin to have a light reflecting property.

The first fluorescent-substance-containing resin layer 107 is a sealing resin layer made of a resin containing a first particulate fluorescent substance. The first fluorescent-substance-containing resin layer 107 is filled in one of areas, which are surrounded by the first resin dam 105 and the second resin dam 106, so that the LED chips 102 and the wires 103, which are provided in the one of areas, are embedded in the first fluorescent-substance-containing resin layer 107. In other words, the first fluorescent-substance-containing resin layer 107 is formed in a spiral pattern in the plan view so as to collectively seal the LED chips 102 of the series circuit section A.

The second fluorescent-substance-containing resin layer 108 is a sealing resin layer made of a resin containing a second particulate fluorescent substance. The second fluorescent-substance-containing resin layer 108 is filled in the other of areas, which are surrounded by the first resin dam 105 and the second resin dam 106, so that the LED chips 102 and the wires 103, which are provided in the other of areas, are embedded in the second fluorescent-substance-containing resin layer 108. In other words, the second fluorescent-substance-containing resin layer 108 is formed in a spiral pattern in the plan view so as to collectively seal the LED chips 102 of the series circuit section B.

The first particulate fluorescent substance is a green fluorescent substance, specifically, a $Ca_3(Sc.Mg)_2Si_3O_{12}:Ce$ fluorescent substance. The second particulate fluorescent substance is a red fluorescent substance, specifically, a $(Sr.Ca)AlSiN_3:Eu$ fluorescent substance.

This allows the area, in which the first fluorescent-substance-containing resin layer 107 is formed, to serve as a light-emitting section (first light-emitting section) which emits blue light and green light by the blue LEDs and the green fluorescent substance. Further, the area, in which the second fluorescent-substance-containing resin layer 108 is formed, serves as a light-emitting section (second light-emitting section) which emits blue light and red light by the blue LEDs and the red fluorescent substance.

(Method for Manufacturing Light-Emitting Device)

The following description will discuss a method for manufacturing the light-emitting device 100 having the above described configuration.

FIG. 7 is a flowchart illustrating a flow of manufacturing the light-emitting device 100. The method for manufacturing the light-emitting device 100 includes a step of forming an electrode wiring pattern (step S1), a step of forming a printed resistor element (step S2), a step of mounting LED chips (step S3), a step of forming a first resin dam and a second resin dam (step S4), a step of forming a first fluorescent-substance-containing resin layer (step S5), and a step of forming a second fluorescent-substance-containing resin layer (step S6) (see FIG. 7).

The following description will discuss details of each of the steps. Note that dimensions of the constituent members described below are merely an example, and the light-emitting device 100 is not limited to such dimensions.

<Step of Forming Electrode Wiring Pattern>

First, as is illustrated in FIG. 3, the wiring lines 109a through 109d and the electrode lands 110 through 113 are formed on the upper surface of the substrate 101. Specifically, the substrate 101 having a predetermined size (i.e., overall size: 24 mm×20 mm, thickness: 1 mm) is prepared. Then, an electrically conductive pattern is formed on the upper surface of the substrate 101 by printing wires made of gold (Au), so that the wiring lines 109a through 109d (width: 300 μm, thickness: 10 μm) are formed. Subsequently, an electrically conductive pattern is formed on the same surface by printing wires made of silver-platinum (Ag—Pt), so that the electrode lands 110 through 113 (length: 3.5 mm, width: 1.4 mm, thickness: 20 μm) are formed. As such, the wiring lines 109a through 109d and the electrode lands 110 through 113 are formed in predetermined locations.

Note that it is preferable to provide, on the upper surface of the substrate 101, marks (e.g., numbers as illustrated in FIG. 3) in the vicinity of the respective electrode lands 110 through 113 so that the electrode lands 110 through 113 can be visually identified. This makes it possible to easily recognize that (i) the electrode lands 110 and 111 are a pair of anode and cathode electrodes corresponding to the series circuit section A and (ii) the electrode lands 112 and 113 are a pair of anode and cathode electrodes corresponding to the series circuit section B.

<Step of Forming Printed Resistor Element>

Next, the printed resistor elements 104 are provided on the upper surface of the substrate 101 (see FIG. 3). Specifically, after a paste containing a resistance component is screen-printed on the substrate 101, the substrate 101 is baked in an electric furnace so that the paste is fixed. Thus, the printed resistor elements 104 (width: 0.2 μm, thickness: 10 μm, resistance: 1 MΩ) are formed. The paste contains ruthenium oxide ($RuO_2$) as a main component. As such, the printed resistor elements 104 are formed in predetermined locations. FIG. 3 illustrates a state in which the printed resistor elements have been formed.

In the above description, a formation order is employed in which the printed resistor elements 104 are formed after the electrode wiring pattern is formed. Note, however, that the formation order can be reversed. Moreover, in the step of forming the electrode wiring pattern, the formation order of the wiring lines 109a through 109d and the electrode lands 110 through 113 can be reversed. It is therefore possible to carry out the formation in a suitable order by taking into consideration working efficiency and the like.

<Step of Mounting LED Chip>

Subsequently, the LED chips 102 are mounted on the upper surface of the substrate 101 (see FIG. 4). Specifically, first, 52 LED chips 102 are die-bonded in respective predetermined locations (from a periphery to a center) by the use of, for example, a silicone resin. Each of the LED chips 102 has a rectangular shape in the plan view (width: 360 μm, length: 440 μm, height: 80 μm). On a rectangular upper surface of each of the LED chips 102, two chip electrodes for respective anode and cathode are provided.

Next, wire-bonding is carried out with the use of the wires 103 so that the circuit configuration illustrated in FIG. 2 is achieved and the series of LED chips 102 are arranged and connected with each other in the spiral pattern. First, the wiring line 109a is connected to a chip electrode of an LED chip 102 via a wire 103, then any adjacent two chip electrodes of the LED chips 102 are connected to each other via a wire 103, and then a chip electrode of an LED chip 102 is connected to the wiring line 109b via a wire 103. Moreover, the wiring line 109c is connected to a chip electrode of an LED chip 102 via a wire 103, then any adjacent two chip electrodes of the LED chips 102 are connected to each other via a wire 103, and then a chip electrode of an LED chip 102 is connected to the wiring line 109d via a wire 103.

As such, the series circuit section A is configured in which the 26 LED chips 102 are (i) connected in series with each other between the electrode land 110 and the electrode land 111 and (ii) arranged in the spiral pattern. Moreover, the series circuit section B is configured in which the 26 LED chips 102 are (i) connected in series with each other between the electrode land 112 and the electrode land 113 and (ii) arranged in the spiral pattern. FIG. 4 illustrates a state in which the LED chips have been mounted.

<Step of Forming First Resin Dam and Second Resin Dam>

Subsequently, the first resin dam 105 and the second resin dam 106 are formed on the upper surface of the substrate 101 (see FIG. 5). Specifically, a liquid white silicone resin (containing a light diffusion filler $TiO_2$) is depicted in a predetermined location with the use of, for example, a dispenser. In this case, a pattern of the first resin dam 105 is depicted in the formation location, and then a pattern of the second resin dam 106 is depicted in the formation location. In this case, a start point of forming the second resin dam 106 is in contact with the first resin dam 105, and an end point of forming the second resin dam 106 is also in contact with the first resin dam 105. The second resin dam 106 does not make contact with the LED chips 102.

Then, the liquid white silicone resin is thermally hardened at a temperature of 150° C. for a time of 60 minutes so that the first resin dam 105 (width: 1 mm, ring diameter: 16 mm) and the second resin dam 106 (width: 0.5 mm) are formed. Note that the temperature and the time are merely an example, and are not limited to the example.

By forming the second resin dam 106 in the spiral pattern inside the first resin dam 105, it is possible to form different fluorescent-substance-containing resin layers, i.e., the first fluorescent-substance-containing resin layer 107 and the second fluorescent-substance-containing resin layer 108 in the following step. The second resin dam 106 serves as a boundary wall between the first fluorescent-substance-containing resin layer 107 and the second fluorescent-substance-containing resin layer 108. By causing the start point and the end point of forming the second resin dam 106 to contact with the first resin dam 105 as above described, it is possible to surely separate the first fluorescent-substance-containing resin layer 107 and the second fluorescent-substance-containing resin layer 108. FIG. 5 illustrates a state in which the first resin dam and the second resin dam have been formed.

The first resin dam 105 thus formed covers a part of the wiring lines 109a through 109d. The second resin dam 106 covers a part of the wiring lines 109b and 109d. This makes it possible to inhibit the wiring lines 109a through 109d from absorbing light.

In the manufacturing step above described, a formation order is employed in which the LED chips 102 are mounted and then the first resin dam 105 and the second resin dam 106 are formed. Note, however, that it is possible to employ a formation order in which, in reverse, the first resin dam 105 and the second resin dam 106 are formed and then the LED chips 102 are mounted. It is therefore possible to carry out the steps in a suitable order by taking into consideration working efficiency and the like.

<Step of Forming First Fluorescent-Substance-Containing Resin Layer>

Subsequently, the first fluorescent-substance-containing resin layer 107 is formed on the upper surface of the substrate 101 (see FIG. 6). Specifically, a fluorescent particle containing resin, in which the first particulate fluorescent substance is dispersed in a transparent liquid silicone resin, is poured so as to fill one of areas surrounded by the first resin dam 105 and the second resin dam 106. The fluorescent particle containing resin, which has been poured, is thermally hardened at a temperature of 150° C. for a time of 30 minutes, so that the first fluorescent-substance-containing resin layer 107 is formed. Note that the temperature and the time are merely an example, and are not limited to the example.

As such, the first fluorescent-substance-containing resin layer 107 is formed in a predetermined location. Specifically, the first fluorescent-substance-containing resin layer 107 is formed in the spiral pattern in the plan view so as to collectively seal the LED chips 102 of the series circuit section A. FIG. 6 illustrates a state in which the first fluorescent-substance-containing resin layer has been formed.

<Step of Forming Second Fluorescent-Substance-Containing Resin Layer>

The second fluorescent-substance-containing resin layer 108 is formed on the upper surface of the substrate 101 (see FIG. 1). Specifically, a fluorescent particle containing resin in which the second particulate fluorescent substance is dispersed in a transparent liquid silicone resin is poured so as to fill the other of the areas surrounded by the first resin dam 105 and the second resin dam 106. The fluorescent particle containing resin, which has been poured, is thermally hardened at a temperature of 150° C. for a time of 5 hours, so that the second fluorescent-substance-containing resin layer 108 is formed.

As such, the second fluorescent-substance-containing resin layer 108 is formed in a predetermined location. Specifically, the second fluorescent-substance-containing resin layer 108 is formed in the spiral pattern in the plan view so as to collectively seal the LED chips 102 of the series circuit section B.

As such, the light-emitting device 100 illustrated in FIG. 1 can be produced. According to the light-emitting device 100, it is possible to separately control a light emission from the first fluorescent-substance-containing resin layer 107 and a light emission from the second fluorescent-substance-containing resin layer 108 by supplying electric power via external terminals which are connected with the respective electrode lands 110 through 113.

According to the light-emitting device 100, the first fluorescent-substance-containing resin layer 107 and the second fluorescent-substance-containing resin layer 108 are provided in respective areas which are separated by the second resin dam 106. Therefore, light emission surfaces configured by respective of the first fluorescent-substance-containing resin layer 107 and the second fluorescent-substance-containing resin layer 108 are located close to each other. Moreover, a boundary (spiral pattern) between the light emission surfaces substantially uniformly lies in the entire area inside the first resin dam 105. Therefore, in a case where the light sources are directly viewed, the light sources are more likely to be viewed as a single light-emitting point of a mixed color, and this allows (i) a separation between the light-emitting points and (ii) a separation between emission light colors to be hardly recognized.

As such, the light-emitting device 100 has the configuration in which (i) the two areas, which are surrounded by the first resin dam 105 and the second resin dam 106, are formed to have the spiral pattern, (ii) the first light-emitting section, which is configured by the LED chips 102 of the series circuit section A and the first fluorescent-substance-containing resin layer 107, is formed in one of the two areas, and (iii) the second light-emitting section, which is configured by the LED chips 102 of the series circuit section B and the second fluorescent-substance-containing resin layer 108, is formed in the other of the two areas. The first light-emitting section emits blue light and green light by the blue LEDs and the green fluorescent substance. The second light-emitting section emits blue light and red light by the blue LEDs and the red fluorescent substance. Consequently, the light-emitting device 100 emits white light, which is obtained by mixing the blue light, the green light, and the red light.

Moreover, it is possible to separately drive the first light-emitting section and the second light-emitting section by utilizing (i) the electrode lands 110 and 111 which are electrically connected with the LED chips 102 in the first light-emitting section and (ii) the electrode lands 112 and 113 which are electrically connected with the LED chips 102 in the second light-emitting section.

As such, since the light-emitting sections can be separately driven, (i) it is possible to turn on only one of the light-emitting sections and (ii) it is possible to easily adjust light, which is obtained by mixing lights emitted from the light-emitting sections and is emitted as light from the entire light-emitting device, to have an intended chromaticity by adjusting lighting conditions (i.e., light emission intensities) of the respective light-emitting sections.

Moreover, each of the light-emitting sections is not formed in an agglomerated shape but is formed in an intricate shape, i.e., the spiral pattern. Under the circumstances, equivalent light-distribution characteristics are to be arranged close to each other in the intricate pattern, and this makes it possible to easily mix the colors when the light-emitting sections are simultaneously turned on. From this, it is possible to obtain a remarkably excellent mixed color. Moreover, since the light-emitting sections are arranged close to each other, identical thermal influence is to be exerted on the light-emitting sections. This allows a brightness and a color tone of the generated white light to be hardly influenced by heat and a change with time. Moreover, it is possible to reduce a variation in peak wavelength and a large variation in color rendering property.

Each of the light-emitting sections is configured to emit at least one color of light, which color is different from that of light emitted from the other of the light-emitting sections. This makes it possible to obtain light whose color is obtained by mixing at least two colors. As such, it is possible to easily adjust a chromaticity of light emitted by the entire light-emitting device. This makes it possible to easily obtain a high color rendering property, depending on a combination of colors of lights emitted from the light-emitting sections.

Therefore, according to the light-emitting device 100, it is possible to obtain a higher mixed color performance as compared with a conventional technique, and it is also possible to easily emit light whose color can be easily adjusted and which has a high color rendering properly.

According to the light-emitting device 100, one of the printed resistor elements 104 is connected in parallel with the LED chips 102 which are connected with each other between the electrode lands 110 and 111, and the other of the printed resistor elements 104 is connected in parallel with the LED chips 102 which are connected with each other between the electrode lands 112 and 113. This makes it possible to (i) prevent the LED chips 102 from being deteriorated, and accordingly to (ii) secure long life and reliability.

Moreover, the printed resistor elements 104 and the wiring line 109 are mostly located below the first resin dam 105. This makes it possible to inhibit the printed resistor elements 104 and the wiring line 109 from absorbing light, and it is therefore possible to increase optical power. Further, it is possible to protect the printed resistor elements 104 and the wiring line 109 from outside by the first resin dam 105. Further, a part located under the first resin dam 105 is efficiently used, and it is therefore possible to reduce a size of the light-emitting device 100 even though the printed resistor elements 104 are provided.

Note that, according to the light-emitting device 100 above described, the number of LED chips 102 provided in one (1) light-emitting section is not limited to the number illustrated in FIG. 1, provided that the number is a plural number. Moreover, how the plurality of LED chips 102 constituting one (1) light-emitting section are connected with each other is not limited to the series connection, and the plurality of LED chips 102 can be connected in parallel with each other or can be connected with each other in a series-parallel manner. The wiring line 109 can be formed in a suitable location in accordance with the circuit configuration of the LED chips 102. Each of the electrode lands 110 through 113 can be set to serve as an anode electrode or as a cathode electrode, depending on a direction of polarity of the arranged LED chips 102.

According to the light-emitting device 100, the number of the light-emitting sections is not limited to two, and can be three or more. The number of areas separated by the second resin dam 106 can be changed in accordance with the number of light-emitting sections. In a case where three or more light-emitting sections are provided, it is preferable to provide the same number of electrode lands, which serve as respective anode electrodes, as the number of the light-emitting sections. This makes it possible to separately drive the light-emitting sections. Note that, in this case, (i) the number of electrode lands, which serve as respective cathode electrodes, can be the same as the number of the light-emitting sections or (ii) a single electrode land can be shared (i.e., cathode electrodes can be integrated).

The first particulate fluorescent substance is not limited to the green fluorescent substance and the second particulate fluorescent substance is not limited to the red fluorescent substance, provided that (i) the first particulate fluorescent substance is different from the second particulate fluorescent substance and (ii) the light-emitting device 100 can emit light of a predetermined color (chromaticity) by combining the color of light emitted by the LED chips 102 and colors of the respective first and second particulate fluorescent substances. In a case where three or more light-emitting sections are provided, it is sufficient to configure the light-emitting sections such that at least one color of light emitted from any one of the light-emitting sections is different from at least one color of light emitted from at least another one of the light-emitting sections.

Note that, from a practical view of generating (i) white light whose chromatic deviation is inhibited and (ii) light of a warm mixed color (e.g., light bulb color), it is preferable that (i) at least one of the light-emitting sections emits at least blue light having a blue wavelength spectrum and yellow light having a yellow wavelength spectrum and (ii) at least another one of the light-emitting sections emits at least red light having a red wavelength spectrum.

In general, white light generated by mixing blue light and yellow light becomes pseudo white light, which is yellowish in whole, because a red light component is weak. On the other hand, according to the configuration above described, it is possible to adjust a ratio between pseudo white light and red light. This makes it possible to enhance the red light component, and it is therefore possible to easily obtain white light whose chromatic deviation is inhibited. Moreover, by increasing red light, it is possible to generate light having a warm mixed color (e.g., light bulb color).

The fluorescent-substance-containing resin layer in each of the light-emitting sections can be configured by a light-transmitting resin containing no fluorescent substance, depending on a color of light emitted by the entire light-emitting device. The sealing resin layer in each of the light-emitting sections can be configured by any of (i) a light-transmitting resin containing one (1) fluorescent substance, (ii) a light-transmitting resin containing a plurality of fluorescent substances, and (iii) a light-transmitting resin containing no fluorescent substance. A content of a fluorescent substance can be varied for each of the light-emitting sections.

According to the light-emitting device 100, the second resin dam 106 is formed in the spiral pattern in the plan view. Therefore, each of the light-emitting sections is formed in the spiral pattern. Note, however, that the shape of each of the light-emitting sections is not limited to this. For example, each of the light-emitting sections can have (i) a spiral shape which is partially constituted by a straight line part or (ii) a shape formed by straight line parts which are connected by corners so as to extend from the periphery to the center. The second resin dam 106 (i.e., a boundary) between adjacent light-emitting sections is configured to have a one-piece shape that separates the light-emitting sections having any of the above described shapes in the plan view.

In other words, in a case where (i) at least two light-emitting sections are formed in respective areas on the upper surface of the substrate 101 and, (ii) when viewed in a direction perpendicular to the upper surface, a center of the areas is assumed as a reference point, each of fluorescent-substance-containing resin layers of the respective light-emitting sections is configured so as to have, in a cross section which passes through the reference point and is perpendicular to the upper surface, a plurality of cross sections each of which is arranged to be adjacent to a cross section of any of the other fluorescent-substance-containing resin layers. This makes it possible to obtain the excellent mixed color performance.

A planar shape of the first resin dam 105 is not limited to the annular shape, and can be a polygonal ring shape or a polygonal ring shape whose corners are rounded off. Note, however, that the annular shape is particularly preferable because a light emitting area of the entire light-emitting device 100 becomes a circular shape when all the LED chips 102 are simultaneously turned on, and accordingly the light is more likely to be emitted uniformly in all directions. This makes it easy (i) to apply the light-emitting device 100 to a general-purpose lighting apparatus and (ii) to design such a lighting apparatus.

According to the light-emitting device 100, all the LED chips 102 have identical shapes. Note, however, that the LED chips 102 are not limited to this, and can have different shapes and/or different sizes as appropriate. For example, the upper surface of the LED chip 102 is not limited to the rectangular shape and can have a square shape. This makes it possible to increase a degree of freedom in arranging the LED chips 102.

A shape of the upper surface of the substrate 101 is not limited to the rectangular shape and can have a shape such as a square shape or a circular shape. According to the light-emitting device 100 above described, the substrate 101 is made of ceramic. Note, however, that the substrate 101 is not limited to this and can be, for example, a metal core substrate in which an insulating layer is formed on a surface of a metal substrate, instead of the ceramic substrate. In this case, it is possible to employ a configuration in which the insulating layer is formed only in an area in which the printed resistor elements 104, the wiring line 109, and the electrode lands 110 through 113 are formed, and the plurality of LED chips 102 are mounted directly on the surface of the metal substrate.

Instead of the printed resistor elements 104 provided for protecting the LED chips 102, it is possible to provide Zener diodes (protection element). It is preferable that the printed resistor elements 104 or the Zener diodes are covered with the first resin dam 105 as much as possible, although not limited to this. Note that the light-emitting device 100 does not necessarily need to include the printed resistor elements 104. A size (resistance) and an arrangement of the printed resistor elements 104 in a circuit are determined in accordance with the number of the LED chips 102 and a use environment (such as a size of a reverse voltage that can be applied to the LED chips 102).

Embodiment 2

Figure 8:
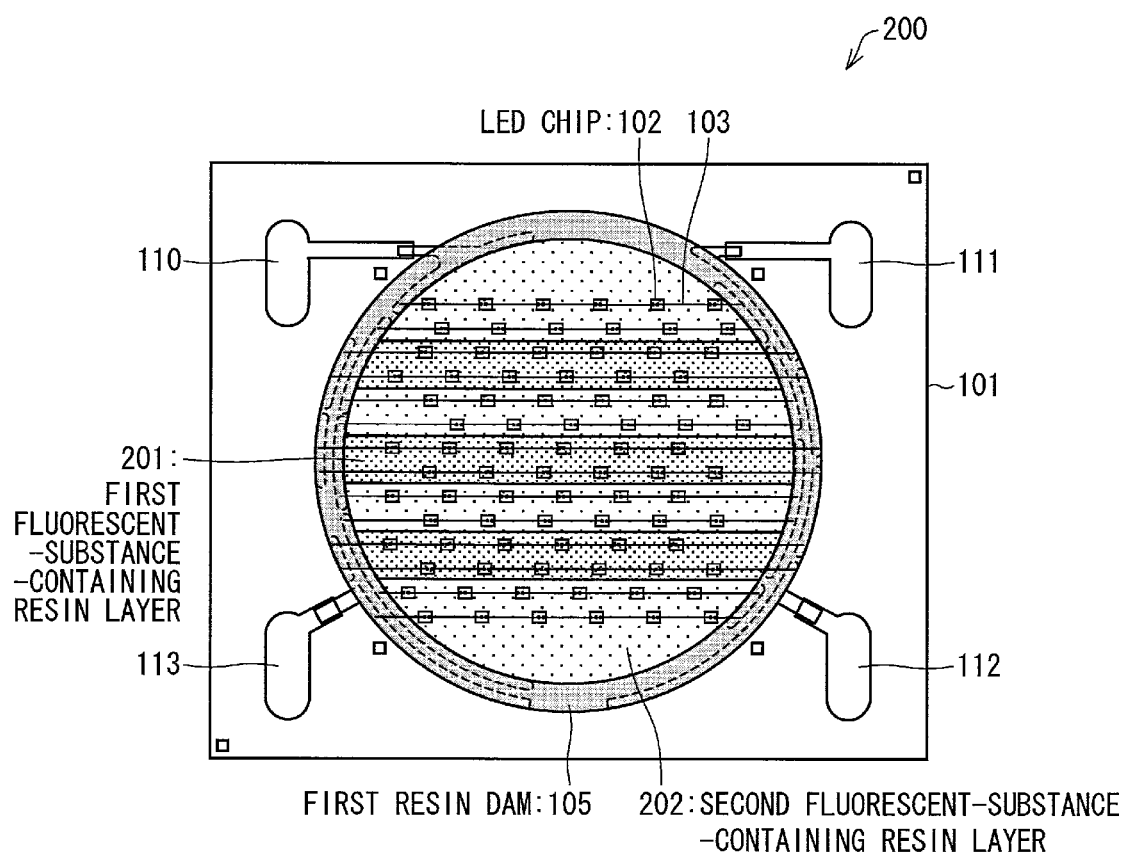
FIG. 8 is a plan view illustrating an example configuration of a light-emitting device in accordance with another embodiment of the present invention.
Figure 10:
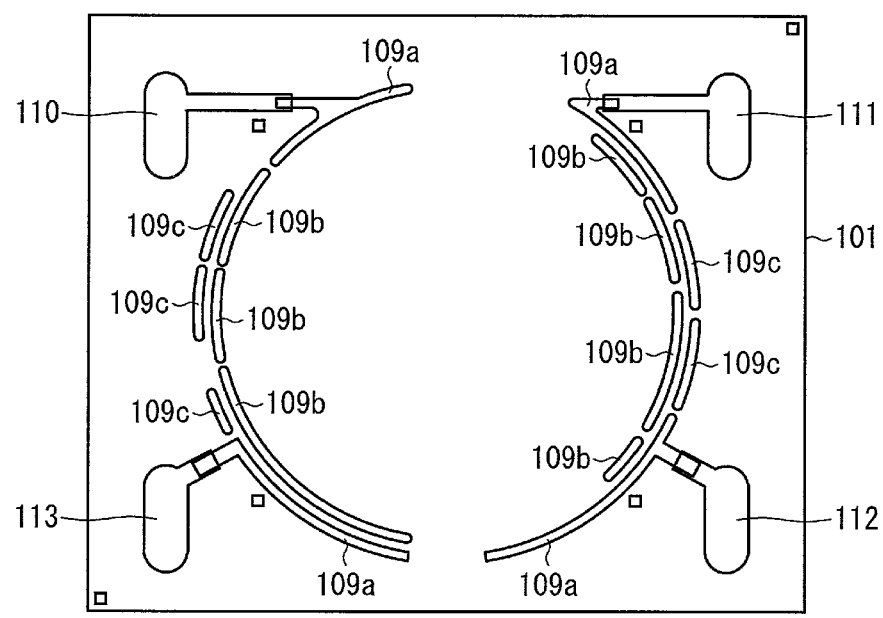
FIG. 10 is a plan view illustrating a configuration in which, in manufacturing the light-emitting device illustrated in FIG. 8, an electrode wiring pattern is formed on the substrate.
Figure 12:
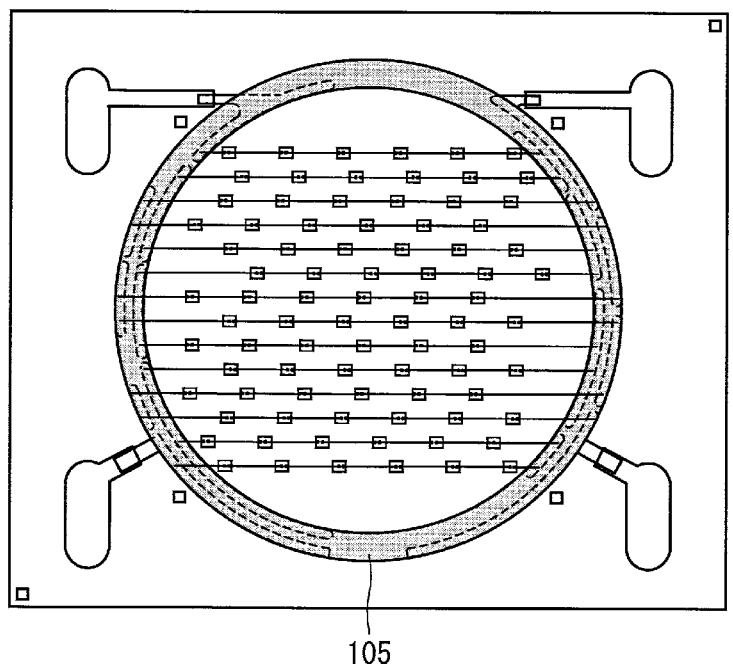
FIG. 12 is a plan view illustrating a configuration in which a first resin dam is formed in manufacturing the light-emitting device illustrated in FIG. 8.

FIG. 8 is a plan view illustrating a configuration example of a light-emitting device 200 in accordance with Embodiment 2. FIG. 9 is a view illustrating a circuit configuration of LED chips 102 in the light-emitting device 200. Each of FIGS. 10 through 13 is a plan view illustrating a configuration in manufacturing the light-emitting device 200. FIG. 10 illustrates a configuration in which an electrode wiring pattern has been formed on the substrate 101. FIG. 11 illustrates a configuration in which LED chips 102 have been mounted. FIG. 12 illustrates a configuration in which a first resin dam 105 has been formed. FIG. 13 illustrates a configuration in which a first fluorescent-substance-containing resin layer 201 has been formed.

The light-emitting device 200 includes a substrate 101, LED chips 102, a first resin dam 105, a first fluorescent-substance-containing resin layer 201 (resin layer), and a second fluorescent-substance-containing resin layer 202 (resin layer) (see FIG. 8).

Specifically, the light-emitting device 200 includes a plurality of LED chips 102 which are electrically connected with each other as illustrated in FIG. 9. The light-emitting device 200 includes (i) a series circuit section in which 48 LED chips 102 are connected in series with each other and (ii) a series circuit section in which 36 LED chips 102 are connected in series with each other. The series circuit sections can be separately driven. Hereinafter, the series circuit section including the 48 LED chips 102 is referred to as "series circuit section C", and the series circuit section including the 36 LED chips 102 is referred to as "series circuit section D".

In Embodiment 2, the LED chips 102, the first resin dam 105, the first fluorescent-substance-containing resin layer 201, and the second fluorescent-substance-containing resin layer 202 are provided on an upper surface of the substrate 101. Further, on the substrate 101, wiring lines 109a through 109c are provided to form a pattern of the circuit configuration illustrated in FIG. 9. Specifically, the wiring lines 109a form an electrode wiring pattern which is connected with the electrode lands 110 through 113 (see FIG. 10). Meanwhile, (i) the wiring lines 109b form a relay wiring pattern for electrically connecting the LED chips 102 with each other via wires 103 which constitute the series circuit section C, and (ii) the wiring lines 109c form a relay wiring pattern for electrically connecting the LED chips 102 with each other via wires 103 which constitute the series circuit section D.

The electrode land 113 serves as an anode electrode for the series circuit section C, and the electrode land 110 serves as a cathode electrode for the series circuit section C. The electrode land 113 is electrically connected with an LED chip 102, which is located in a highest electric potential part of the series circuit section C, via the wiring line 109a and the wire 103. The electrode land 110 is electrically connected with an LED chip 102, which is located in a lowest electric potential part of the series circuit section C, via the wiring line 109a and the wire 103.

The electrode land 111 serves as an anode electrode for the series circuit section D, and the electrode land 112 serves as a cathode electrode for the series circuit section D. The electrode land 111 is electrically connected with an LED chip 102, which is located in a highest electric potential part of the series circuit section D, via the wiring line 109b and the wire 103. The electrode land 112 is electrically connected with an LED chip 102, which is located in a lowest electric potential part of the series circuit section D, via the wiring line 109b and the wire 103.

The wiring lines 109a through 109c are provided under the first resin dam 105. Each of the wiring lines 109a is covered with the first resin dam 105 and extends so as to partially overlap with a corresponding one of the electrode lands 110 through 113. The wiring lines 109a through 109c are not located in an area inside the first resin dam 105.

The LED chips 102 are connected with each other via the wires 103 and the LED chips 102 are connected with the wiring line 109 via the wires 103 so that the series circuit sections C and D are formed. In the series circuit section C, 8 lines of series of LED chips 102 are arranged in a column direction (y-direction), and in each of the 8 lines, 6 LED chips 102 are arranged in a row direction (x-direction). In the series circuit section D, 2 lines of series of 6 LED chips 102 are provided in each of (i) a location between 2 and 3 rows of the series circuit section C, (ii) a location between 4 and 5 rows of the series circuit section C, and (iii) a location between 6 and 7 rows of the series circuit section C. In other words, in the light-emitting device 200, two lines of the LED chips 102 of the series circuit section C and two lines of the LED chips 102 of the series circuit section D are alternately arranged in the column direction.

In the series circuit section C, the lines of 6 LED chips 102 are electrically connected with each other via wires 103 and the wiring lines 109b. Similarly, in the series circuit section D, the lines of 6 LED chips 102 are electrically connected with each other via wires 103 and the wiring lines 109c.

In the area inside the first resin dam 105, the first fluorescent-substance-containing resin layer 201 and the second fluorescent-substance-containing resin layer 202 are formed.

The first fluorescent-substance-containing resin layer 201 is a sealing resin layer made of a resin containing a first particulate fluorescent substance. The first fluorescent-substance-containing resin layer 201 is provided in the area inside the first resin dam 105 so that the LED chips 102 and the wires 103 of the series circuit section D are embedded in the first fluorescent-substance-containing resin layer 201. In other words, the first fluorescent-substance-containing resin layer 201 is formed as separate layers which seal respective groups of the LED chips 102 of the series circuit section D. In the arrangement, the first fluorescent-substance-containing resin layer 201 is formed as three belts in the plan view.

The second fluorescent-substance-containing resin layer 202 is a sealing resin layer made of a resin containing a second particulate fluorescent substance. The second fluorescent-substance-containing resin layer 202 is provided in the area inside the first resin dam 105 so that the LED chips 102 and the wires 103 of the series circuit section C are embedded in the second fluorescent-substance-containing resin layer 202. In other words, the second fluorescent-substance-containing resin layer 202 is formed as separate layers which seal respective groups of the LED chips 102 of the series circuit section C. In the arrangement, the second fluorescent-substance-containing resin layer 202 is formed as four belts in the plan view.

Therefore, the first fluorescent-substance-containing resin layer 201 and the second fluorescent-substance-containing resin layer 202 are arranged to form a striped pattern (in this case, lateral stripes) in the area inside the first resin dam 105 in the plan view.

The first particulate fluorescent substance is a red fluorescent substance having a peak emission wavelength of approximately 630 nm, specifically, a $(Sr.Ca)AlSiN_3$:Eu fluorescent substance. The second particulate fluorescent substance contains two fluorescent substances, i.e., a green fluorescent substance having a peak emission wavelength of approximately 520 nm and a red fluorescent substance having a peak emission wavelength of approximately 620 nm. In this case, the green fluorescent substance is a $Ca_3(Sc.Mg)_2Si_3O_{12}$:Ce fluorescent substance, and the red fluorescent substance is a $(Sr.Ca)AlSiN_3$:Eu fluorescent substance.

This allows the area, in which the first fluorescent-substance-containing resin layer 201 is formed, to serve as a light-emitting section (first light-emitting section) which emits blue light and red light by the blue LEDs and the red fluorescent substance. Further, the area, in which the second fluorescent-substance-containing resin layer 202 is formed, serves as a light-emitting section (second light-emitting section) which emits blue light, green light, and red light by the blue LEDs, the green fluorescent substance, and the red fluorescent substance.

(Method for Manufacturing Light-Emitting Device)

The light-emitting device 200 having the configuration above described can be manufactured in an order similar to that of the method for manufacturing the light-emitting device 100 described with reference to FIG. 7 in Embodiment 1.

Specifically, the method for manufacturing the light-emitting device 200 includes a step of forming an electrode wiring pattern (corresponding to the step S1 in FIG. 7), a step of mounting LED chips (corresponding to the step S3 in FIG. 7), a step of forming a first resin dam (corresponding to the step S4 in FIG. 7), a step of forming a first fluorescent-substance-containing resin layer (corresponding to the step S5 in FIG. 7), and a step of forming a second fluorescent-substance-containing resin layer (corresponding to the step S6 in FIG. 7).

The following description will discuss details of each of the steps. Note that dimensions of the constituent members described below are merely an example, and the light-emitting device 100 is not limited to such dimensions.

<Step of Forming Electrode Wiring Pattern>

First, the wiring lines 109a through 109c and the electrode lands 110 through 113 are formed on the upper surface of the substrate 101 (see FIG. 10). Thus, the wiring lines 109a through 109c (width: 300 μm, thickness: 10 μm) and the electrode lands 110 through 113 (length: 3.5 mm, width: 1.4 mm, thickness: 20 μm) are formed in predetermined locations on the upper surface of the substrate 101 (overall size: 24 mm×20 mm, thickness: 1 mm). FIG. 10 illustrates a state in which the electrode wiring pattern has been formed.

<Step of Mounting LED Chip>

Subsequently, the LED chips 102 are mounted on the upper surface of the substrate 101 (see FIG. 11). Specifically, first, 84 LED chips 102 are die-bonded in respective predetermined locations by the use of, for example, a silicone resin.

Next, wire-bonding is carried out with the use of the wires 103 so that the circuit configuration illustrated in FIG. 9 is achieved and the wires 103 are arranged so as to extend in the row direction. That is, the LED chips 102 are connected with the wiring lines 109a through 109c and the LED chips 102 are connected with each other via the wires 103, one by one.

As such, the series circuit section C is configured in which the 48 LED chips 102 are (i) connected in series with each other between the electrode land 113 and the electrode land 110 and (ii) arranged in a belt-like pattern. Moreover, the series circuit section D is configured in which the 36 LED chips 102 are (i) connected in series with each other between the electrode land 111 and the electrode land 112 and (ii) arranged in a belt-like pattern. FIG. 11 illustrates a state in which the LED chips have been mounted.

<Step of Forming First Resin Dam>

Subsequently, the first resin dam 105 is formed on the upper surface of the substrate 101 (see FIG. 12). As such, the first resin dam 105 having an annular shape (width: 1 mm, ring diameter: 16 mm) is formed in a predetermined location. FIG. 12 illustrates a state in which the first resin dam has been formed.

The first resin dam 105, which is thus formed, substantially entirely covers the wiring lines 109a through 109c. Moreover, the wiring lines 109a through 109c are not formed in the area inside the first resin dam 105. This makes it possible to considerably inhibit the wiring lines 109a through 109c from absorbing light.

<Step of Forming First Fluorescent-Substance-Containing Resin Layer>

Subsequently, the first fluorescent-substance-containing resin layer 201 is formed on the upper surface of the substrate 101 (see FIG. 13). Specifically, the first fluorescent-substance-containing resin layer 201 is formed by providing a fluorescent particle containing resin, in which the red fluorescent substance is dispersed in a transparent silicone resin, to a predetermined location.

Note that the silicone resin of the first fluorescent-substance-containing resin layer 201 has high thixotropy and no fluidity. The "thixotropy" is a property of having high viscosity in a normal state but being less viscid only while being agitated. For example, such a silicone resin can be obtained by mixing a thixotropy-adding agent with a resin. Therefore, after the first fluorescent-substance-containing resin layer 201 is provided on the upper surface of the substrate 101, the viscosity of the first fluorescent-substance-containing resin layer 201 is increased in a short time, and the first fluorescent-substance-containing resin layer 201 is hardened without by being heated. As such, the first fluorescent-substance-containing resin layer 201 is formed as belts in the plan view which seal respective groups of the LED chips 102 of the series circuit section D. By thus configuring the first fluorescent-substance-containing resin layer 201 with the use of a resin having thixotropy (viscosity) higher than that of the second fluorescent-substancecontaining resin layer 202, it is not necessary to thermally harden the first fluorescent-substance-containing resin layer 201 at this point.

The first fluorescent-substance-containing resin layer 201 serves as a so-called resin dam (resin wall) for forming the second fluorescent-substance-containing resin layer 202. That is, the first fluorescent-substance-containing resin layer 201 can be used as a dam member without being hardened. The second fluorescent-substance-containing resin layer 202 is formed between the dams formed by the first fluorescent-substance-containing resin layer 201. FIG. 13 illustrates a state in which the first fluorescent-substance-containing resin layer has been formed. The first fluorescent-substance-containing resin layer 201 is to be completely hardened in a thermal hardening process in forming the second fluorescent-substance-containing resin layer 202.

<Step of Forming Second Fluorescent-Substance-Containing Resin Layer>

The second fluorescent-substance-containing resin layer 202 is formed on the upper surface of the substrate 101 (see FIG. 8). Specifically, a fluorescent particle containing resin in which the second particulate fluorescent substance is dispersed in a transparent liquid silicone resin is poured so as to fill areas (i.e., four areas in total) surrounded by the first resin dam 105 and the first fluorescent-substance-containing resin layer 201. The fluorescent particle containing resin, which has been poured, is thermally hardened at a temperature of 150° C. for a time of 5 hours, so that the second fluorescent-substance-containing resin layer 202 is formed. At this time, the first fluorescent-substance-containing resin layer 201 is simultaneously hardened.

As such, the second fluorescent-substance-containing resin layer 202 is formed in a predetermined location. That is, the second fluorescent-substance-containing resin layer 202 is formed as belts in the plan view which seal the LED chips 102 of the series circuit section C. Moreover, the first fluorescent-substance-containing resin layer 201 is also completely formed.

As such, the light-emitting device 200 illustrated in FIG. 8 can be produced. According to the light-emitting device 200, it is possible to separately control a light emission from the first fluorescent-substance-containing resin layer 201 and a light emission from the second fluorescent-substance-containing resin layer 202 by supplying electric power via external terminals which are connected with the respective electrode lands 110 through 113.

According to the light-emitting device 200, the first fluorescent-substance-containing resin layer 201 is making contact with the second fluorescent-substance-containing resin layer 202, and accordingly the light emission surfaces are arranged close to each other. Moreover, the first fluorescent-substance-containing resin layer 201 and the second fluorescent-substance-containing resin layer 202 are alternately arranged in a width direction (in short intervals). Therefore, a plurality of boundaries (stripes) of the light emission surfaces are to be formed in the entire area inside the first resin dam 105. Therefore, in a case where the light sources are directly viewed, the light sources are more likely to be viewed as a single light-emitting point of a mixed color, and this allows (i) a separation between the light-emitting points and (ii) a separation between emission light colors to be hardly recognized.

As such, the light-emitting device 200 has the configuration in which (i) the first light-emitting section, which is configured by the LED chips 102 of the series circuit section D and the first fluorescent-substance-containing resin layer 201 and (ii) the second light-emitting section, which is configured by the LED chips 102 of the series circuit section C and the second fluorescent-substance-containing resin layer 202 are formed in the area inside the first resin dam 105. The first light-emitting section emits blue light and red light by the blue LEDs and the red fluorescent substance. The second light-emitting section emits blue light, green light, and red light by the blue LEDs, the green fluorescent substance, and the red fluorescent substance. Consequently, the light-emitting device 100 emits white light, which is obtained by mixing the blue light, the green light, and the red light.

Moreover, it is possible to separately drive the first light-emitting section and the second light-emitting section by utilizing (i) the electrode lands 111 and 112 which are electrically connected with the LED chips 102 in the first light-emitting section and (ii) the electrode lands 110 and 113 which are electrically connected with the LED chips 102 in the second light-emitting section.

As such, since the light-emitting sections can be separately driven, it is possible to turn on only one of the light-emitting sections. Further, it is possible to easily adjust light, (i) whose color is obtained by mixing colors of lights emitted from the light-emitting sections and (ii) which is emitted as light from the entire light-emitting device, to have an intended chromaticity by adjusting lighting conditions (i.e., light emission intensities) of the respective light-emitting sections.

Moreover, each of the light-emitting sections is not formed in an agglomerated shape but is formed in an intricate shape, i.e., the striped pattern in which the light-emitting sections are alternately arranged (so as to switch in short intervals). Under the circumstances, similar light-distribution characteristics are to be arranged close to each other in the intricate pattern, and this makes it possible to easily mix the colors when the light-emitting sections are simultaneously turned on. From this, it is possible to obtain a remarkably excellent mixed color. Moreover, since the light-emitting sections are arranged close to each other, identical thermal influence is to be exerted on the light-emitting sections. This allows a brightness and a color tone of the generated white light to be hardly influenced by heat and a change with time. Moreover, it is possible to reduce a variation in peak wavelength and a large variation in color rendering property.

Each of the light-emitting sections is configured to emit at least one color of light, which color is different from that of light emitted from the other of the light-emitting sections. This makes it possible to obtain light whose color is obtained by mixing at least two colors. As such, it is possible to easily adjust a chromaticity of light emitted by the entire light-emitting device. This makes it possible to easily obtain a high color rendering property, depending on a combination of colors of lights emitted from the light-emitting sections.

Therefore, according to the light-emitting device 200, it is possible to obtain a higher mixed color performance as compared with a conventional technique, and it is also possible to easily emit light whose color can be easily adjusted and which has a high color rendering properly.

Note that the light-emitting device 200 can also be modified in various ways as with the modification examples of the light-emitting device 100. For example, the number of the light-emitting sections in the light-emitting device 200 is not limited to two and can be three or more. The light-emitting sections, whose number is two or more, are formed such that a plurality of fluorescent-substance-containing resin layers of each of the light-emitting sections are arranged in stripes which are not directly adjacent to each other.

According to the light-emitting device 200, the first fluorescent-substance-containing resin layer 201 has a refractive index which is higher than that of the second fluorescent-substance-containing resin layer 202. By thus employing the first fluorescent-substance-containing resin layer 201 which has the refractive index higher than that of the second fluorescent-substance-containing resin layer 202, light, which is emitted by the LED chips 102 sealed by the second fluorescent-substance-containing resin layer 202 toward the first fluorescent-substance-containing resin layer 201, is reflected by the first fluorescent-substance-containing resin layer 201. This makes it possible to inhibit light from being emitted by the LED chips 102 in a direction in parallel with or in substantially parallel with the second fluorescent-substance-containing resin layer 202. Meanwhile, it is possible to increase efficiency in extracting light which is emitted by the LED chips 102 in a direction perpendicular to the substrate 101 or substantially perpendicular to the substrate 101.

Moreover, it is possible to inhibit light, which is emitted from the first fluorescent-substance-containing resin layer 201, from traveling toward adjacent stripes of the second fluorescent-substance-containing resin layer 202. This makes it possible to inhibit color mixture between the first and second fluorescent-substance-containing resin layers.

Note that, since the first fluorescent-substance-containing resin layer 201 has a high thixotropy and no fluidity, the second fluorescent-substance-containing resin layer 202 can have (i) a thixotropy lower than that of the first fluorescent-substance-containing resin layer 201 and (ii) fluidity. The first fluorescent-substance-containing resin layer 201 serves as the resin dam (resin wall), and therefore the first fluorescent-substance-containing resin layer 201 is not mixed with the second fluorescent-substance-containing resin layer 202. In other words, boundaries between the fluorescent-substance-containing resin layers are substantially clearly defined.

In a case where three or more light-emitting sections are provided, the light-emitting sections are configured such that resin layers, which have no thixotropy (or have a thixotropy which can be considered as substantially zero), are not adjacently arranged. This allows each of the resin layers, which are provided in the respective light-emitting sections, to be formed in a predetermined location without being mixed with the other resin layers of the other light-emitting sections.

According to the light-emitting device 200, the first fluorescent-substance-containing resin layer 201 and the second fluorescent-substance-containing resin layer 202 are configured to directly make contact with each other. Note, however, that it is possible to employ a configuration in which the second resin dam 106 is provided, as described in Embodiment 1. In a case where the second resin dam 106 is provided, the first fluorescent-substance-containing resin layer 201 and the second fluorescent-substance-containing resin layer 202 are successively formed after the second resin dam 106 is provided at a boundary between the light-emitting sections. In this case, it is not necessary to employ a resin having a thixotropy.

Similarly, in a case where a resin having a thixotropy is employed in the light-emitting device 100 of Embodiment 1, it is possible to employ a configuration in which the second resin dam 106 and the first resin dam 105 are not provided.

Embodiment 3

Figure 14:
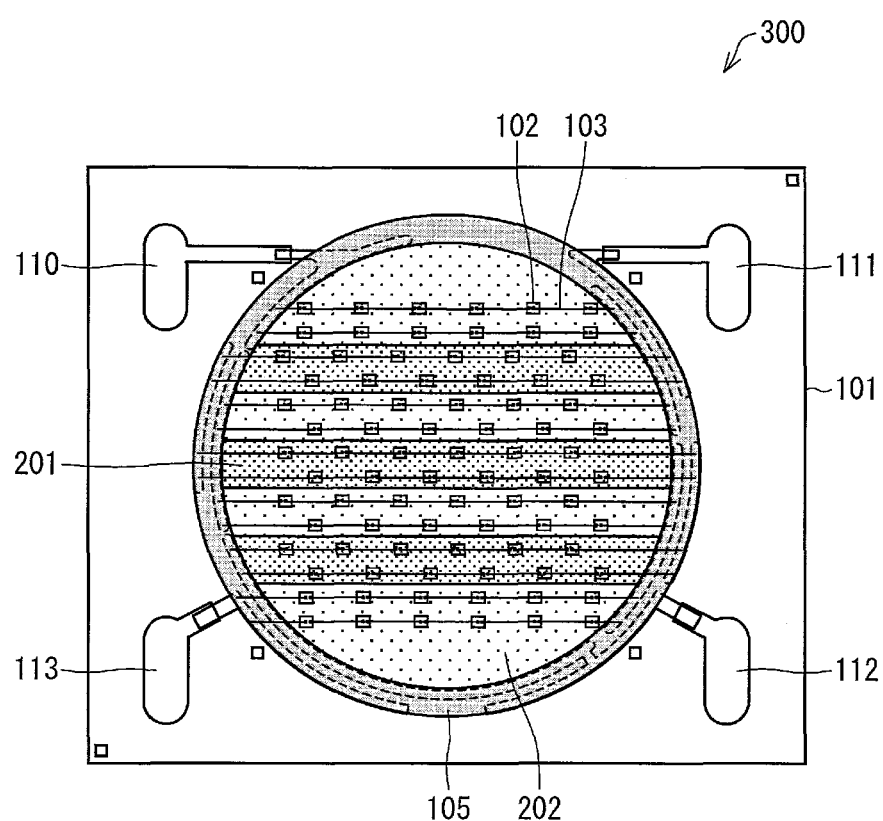
FIG. 14 is a plan view illustrating an example configuration of a light-emitting device in accordance with another embodiment of the present invention.
Figure 15:
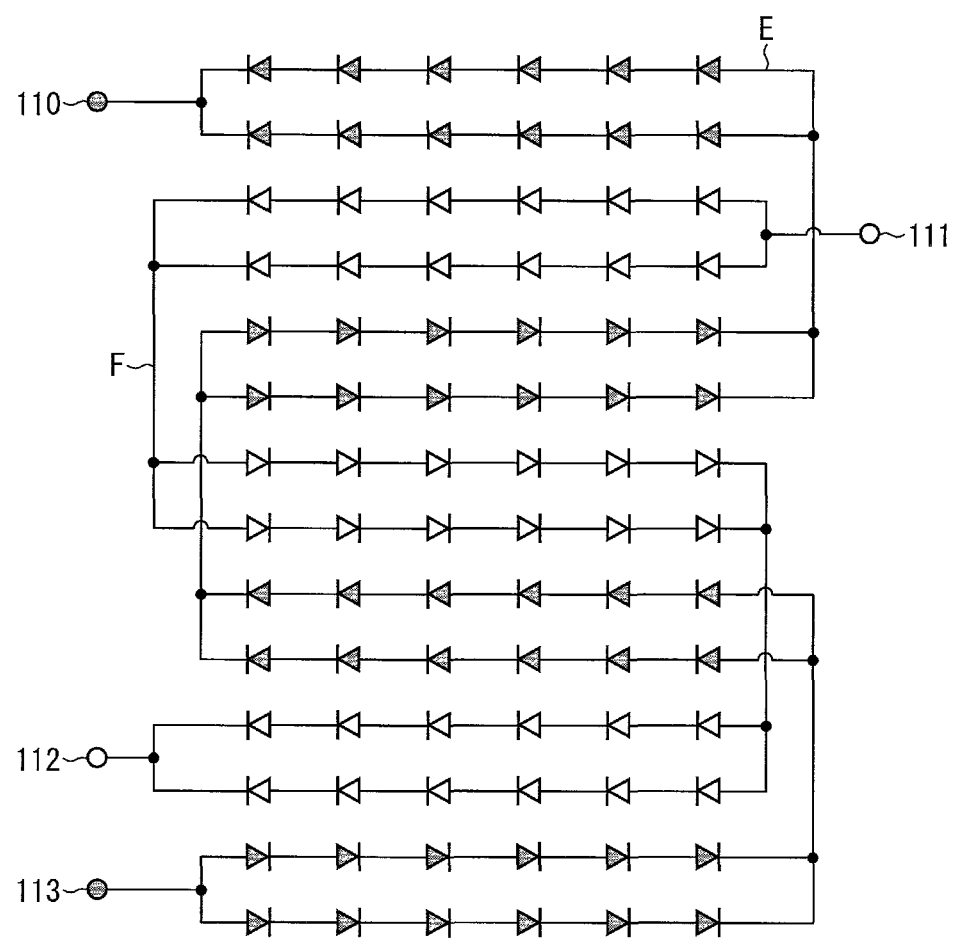
FIG. 15 is a view illustrating a circuit configuration of LED chips in the light-emitting device illustrated in FIG. 14.
Figure 16:
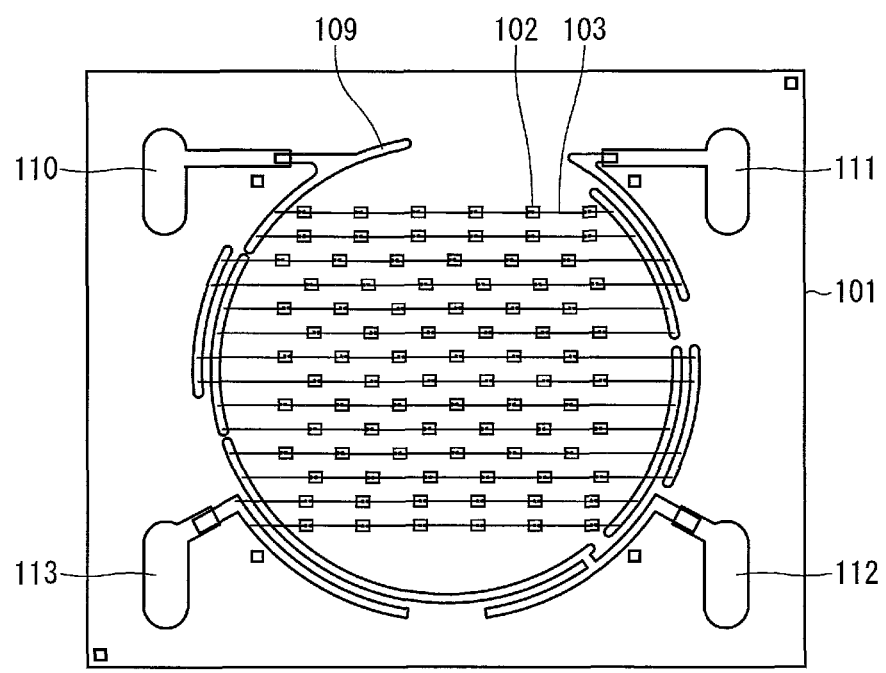
FIG. 16 is a plan view illustrating a configuration in which LED chips are provided in manufacturing the light-emitting device illustrated in FIG. 14.

FIG. 14 is a plan view illustrating a configuration example of a light-emitting device 300 in accordance with Embodiment 3. FIG. 15 is a view illustrating a circuit configuration of LED chips 102 in the light-emitting device 300. FIG. 16 is a plan view illustrating a configuration in which the LED chips 102 are provided in manufacturing the light-emitting device 300.

The light-emitting device 300 of Embodiment 3 has a configuration which is substantially identical with that of the light-emitting device 200 of Embodiment 2, except for the following points.

That is, the light-emitting device 300 includes a plurality of LED chips 102 which are electrically connected with each other as illustrated in FIG. 15. The light-emitting device 300 includes (i) a series-parallel circuit section in which 48 LED chips 102 are connected with each other in a series-parallel manner (i.e., 4 pairs of parallel lines, in each of which 6 LED chips are connected in series, are connected in series) and (ii) a series-parallel circuit section in which 36 LED chips 102 are connected with each other in a series-parallel manner (i.e., 3 pairs of parallel lines, in each of which 6 LED chips are connected in series, are connected in series). Hereinafter, the series-parallel circuit section including the 48 LED chips 102 is referred to as "series-parallel circuit section E" and the series-parallel circuit section including the 36 LED chips 102 is referred to as "series-parallel circuit section F".

In accordance with a circuit configuration illustrated in FIG. 15, a wiring line 109 on the substrate 101 is arranged in a pattern as illustrated in FIG. 16. The LED chips 102 are connected with each other via the wires 103 and the LED chips 102 are connected with the wiring line 109 via the wires 103 so that the series-parallel circuit sections E and F are formed. An arrangement itself of the LED chips 102 is substantially identical with that of the LED chips 102 in the light-emitting device 200.

The first fluorescent-substance-containing resin layer 201 is formed as separate layers (i.e., three layers) which seal respective (three) groups of the LED chips 102 of the series-parallel circuit section F. The second fluorescent-substance-containing resin layer 202 is formed as separate layers (i.e., four layers) which seal respective (four) groups of the LED chips 102 of the series-parallel circuit section E. Therefore, the first fluorescent-substance-containing resin layer 201 and the second fluorescent-substance-containing resin layer 202 are arranged to form a striped pattern in the area inside the first resin dam 105 in the plan view.

The first particulate fluorescent substance of the first fluorescent-substance-containing resin layer 201 is a red fluorescent substance having a peak emission wavelength of approximately 650 nm, specifically, a $CaAlSiN_3:Eu$ fluorescent substance. The second particulate fluorescent substance contains two fluorescent substances, i.e., a green fluorescent substance having a peak emission wavelength of approximately 520 nm and a red fluorescent substance having a peak emission wavelength of approximately 630 nm. In this case, the green fluorescent substance is a $Ca_3(Sc.Mg)_2Si_3O_{12}:Ce$ fluorescent substance, and the red fluorescent substance is a $(Sr.Ca)AlSiN_3:Eu$ fluorescent substance.

This allows the area, in which the first fluorescent-substance-containing resin layer 201 is formed, to serve as a light-emitting section (first light-emitting section) which emits blue light and red light by the blue LEDs and the red fluorescent substance. Further, the area, in which the second fluorescent-substance-containing resin layer 202 is formed, serves as a light-emitting section (second light-emitting section) which emits blue light, green light, and red light by the blue LEDs, the green fluorescent substance, and the red fluorescent substance.

According to the light-emitting device 300, the LED chips 102 are connected in parallel with each other. Specifically, in each of areas in which the first fluorescent-substance-containing resin layer 201 and the second fluorescent-substance-containing resin layer 202 are formed, 6-series×2-parallel LED chips 102 are sealed. According to the configuration, even in a case where any one of the LED chips 102 is broken, it is possible to avoid a state in which all the LED chips 102 stop emitting light.

Embodiment 4

Figure 17:
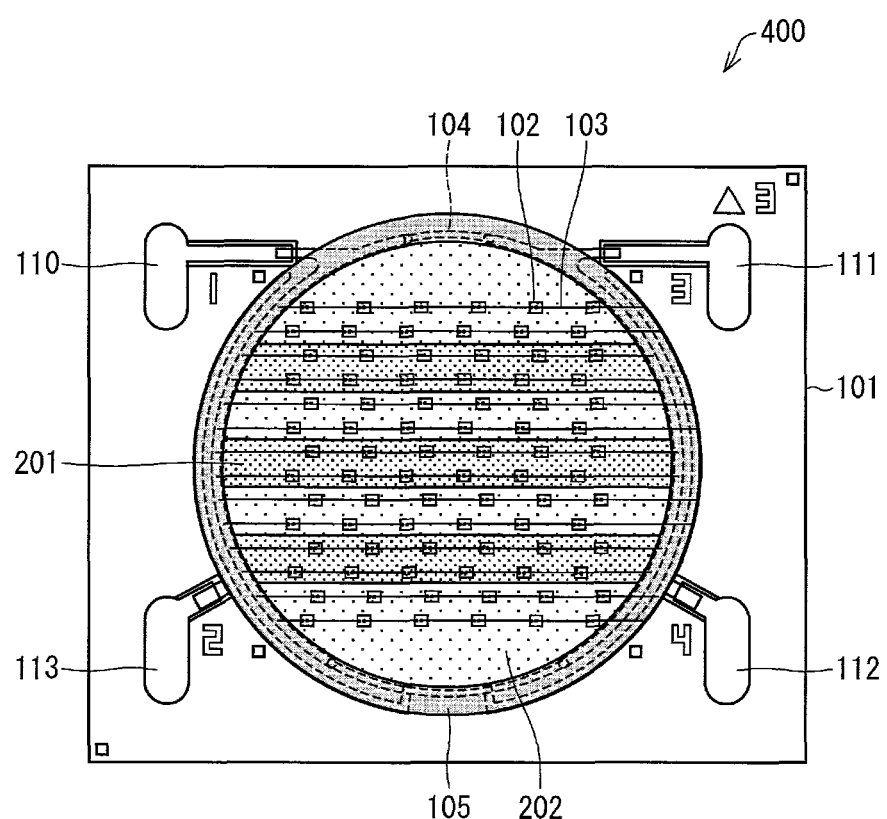
FIG. 17 is a plan view illustrating an example configuration of a light-emitting device in accordance with another embodiment of the present invention.
Figure 18:
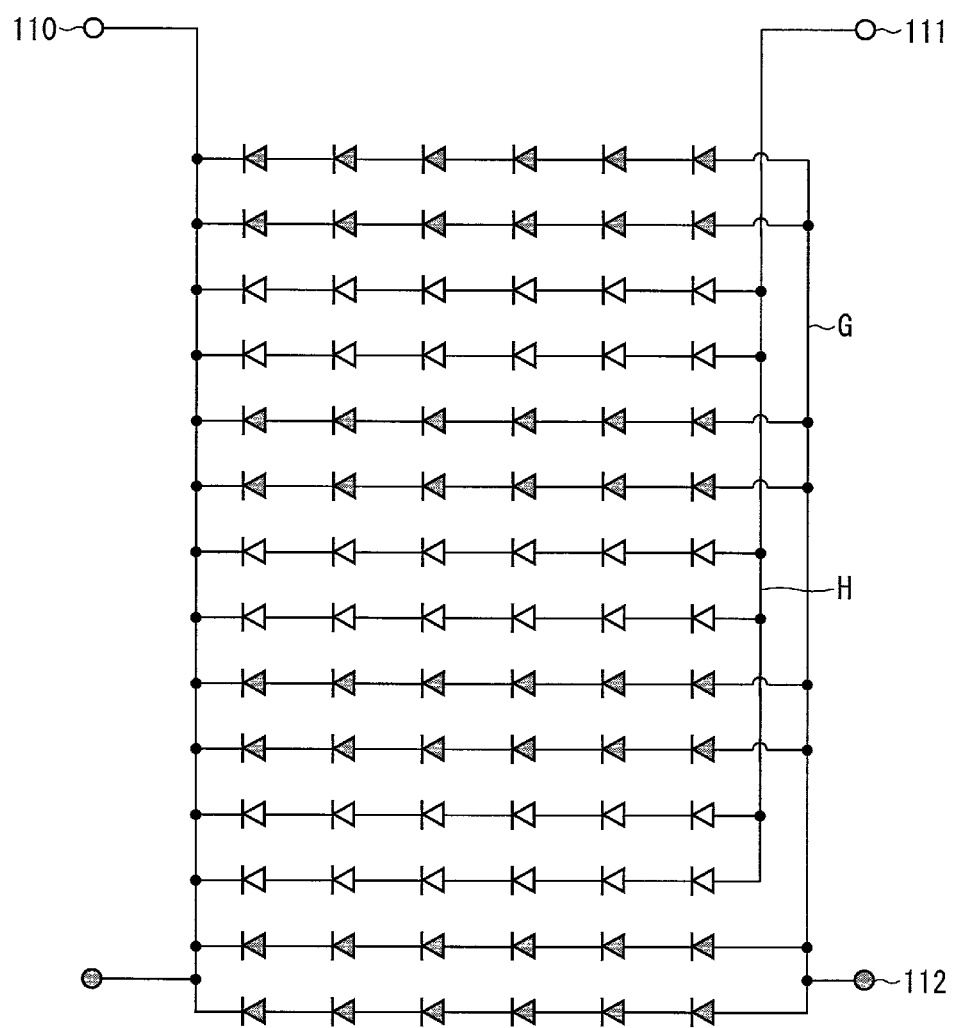
FIG. 18 is a view illustrating a circuit configuration of LED chips in the light-emitting device illustrated in FIG. 17.
Figure 19:
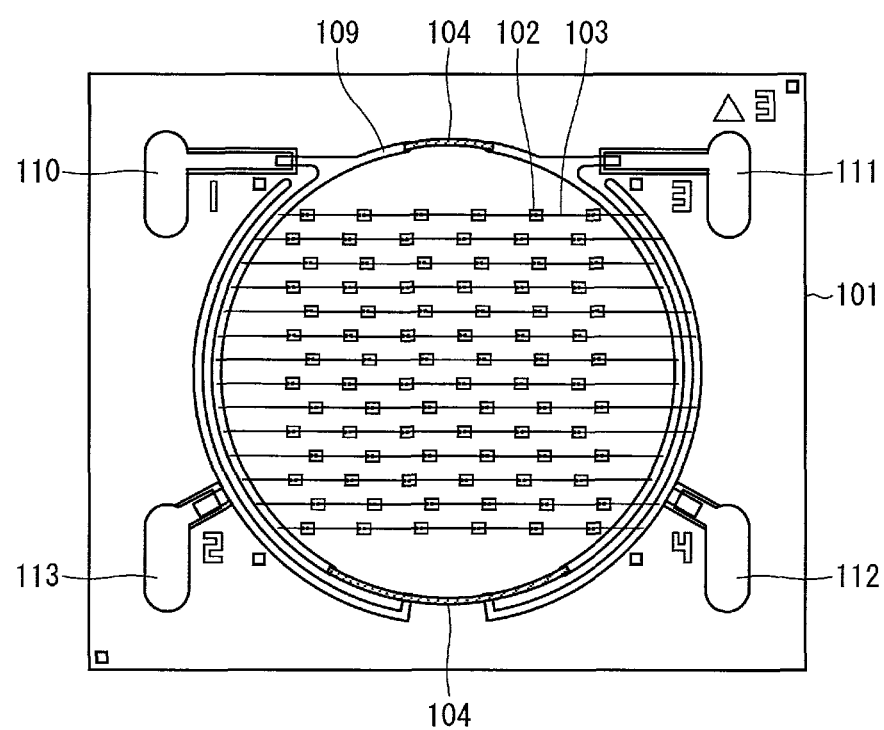
FIG. 19 is a plan view illustrating a configuration in which LED chips are provided in manufacturing the light-emitting device illustrated in FIG. 17.

FIG. 17 is a plan view illustrating a configuration example of a light-emitting device 400 in accordance with Embodiment 4. FIG. 18 is a view illustrating a circuit configuration of LED chips 102 in the light-emitting device 400. FIG. 19 is a plan view illustrating a configuration in which the LED chips 102 are provided in manufacturing the light-emitting device 400.

The light-emitting device 400 of Embodiment 4 has a configuration which is substantially identical with that of the light-emitting device 200 of Embodiment 2, except for the following points.

That is, the light-emitting device 400 includes a plurality of LED chips 102 which are electrically connected with each other as illustrated in FIG. 18. The light-emitting device 400 includes (i) a series-parallel circuit section in which 48 LED chips 102 are connected with each other in a series-parallel manner (i.e., 8 parallel lines in each of which 6 LED chips are connected in series) and (ii) a series-parallel circuit section in which 36 LED chips 102 are connected with each other in a series-parallel manner (i.e., 6 parallel lines in each of which 6 LED chips are connected in series). The series-parallel circuit sections share a cathode electrode. Hereinafter, the series-parallel circuit section including the 48 LED chips 102 is referred to as "series-parallel circuit section G" and the series-parallel circuit section including the 36 LED chips 102 is referred to as "series-parallel circuit section H".

In accordance with a circuit configuration illustrated in FIG. 18, a wiring line 109 on the substrate 101 is arranged in a pattern as illustrated in FIG. 19. The LED chips 102 are connected with each other via the wires 103 and the LED chips 102 are connected with the wiring line 109 via the wires 103 so that the series-parallel circuit sections G and H are formed. An arrangement itself of the LED chips 102 is substantially identical with that of the LED chips 102 in the light-emitting device 200.

The light-emitting device 400 includes two printed resistor elements 104 (see FIG. 19). One of the two printed resistor elements 104 is connected in parallel with the series-parallel circuit section G, and the other of the printed resistor elements 104 is connected in parallel with the series-parallel circuit section H.

The first fluorescent-substance-containing resin layer 201 is formed as separate layers (i.e., three layers) which seal respective (three) groups of the LED chips 102 of the series-parallel circuit section H. The second fluorescent-substance-containing resin layer 202 is formed as separate layers (i.e., four layers) which seal respective (four) groups of the LED chips 102 of the series-parallel circuit section G.

Therefore, the first fluorescent-substance-containing resin layer 201 and the second fluorescent-substance-containing resin layer 202 are arranged to form a striped pattern in the area inside the first resin dam 105 in the plan view.

The first particulate fluorescent substance of the first fluorescent-substance-containing resin layer 201 contains two fluorescent substances, i.e., a green fluorescent substance having a peak emission wavelength of approximately 520 nm and a red fluorescent substance (first red fluorescent substance) having a peak emission wavelength of approximately 630 nm. In this case, the green fluorescent substance is a $Ca_3(Sc.Mg)_2Si_3O_{12}:Ce$ fluorescent substance, and the red fluorescent substance is a $(Sr—Ca)AlSiN_3:Eu$ fluorescent substance. The second particulate fluorescent substance contains two fluorescent substances, i.e., a green fluorescent substance having a peak emission wavelength of approximately 520 nm and a red fluorescent substance (second red fluorescent substance) having a peak emission wavelength of approximately 620 nm. In this case, the green fluorescent substance is a $Ca_3(Sc.Mg)_2Si_3O_{12}:Ce$ fluorescent substance, and the red fluorescent substance is a $(Sr.Ca)AlSiN_3:Eu$ fluorescent substance.

This allows the area, in which the first fluorescent-substance-containing resin layer 201 is formed, to serve as a light-emitting section (first light-emitting section) which emits blue light, green light, and red light by the blue LEDs, the green fluorescent substance, and the red fluorescent substance. Further, the area, in which the second fluorescent-substance-containing resin layer 202 is formed, serves as a light-emitting section (second light-emitting section) which emits blue light, green light, and red light by the blue LEDs, the green fluorescent substance, and the red fluorescent substance.

According to the light-emitting device 400, it is possible to control a color rendering property and a light emission intensity by the use of two red fluorescent substances, i.e., (i) the red fluorescent substance having a peak emission wavelength which is close to a peak of relative luminous efficiency and is in a short wavelength area that largely contributes to a retention and an improvement in the light emission intensity and (ii) the red fluorescent substance having a peak emission wavelength which is in a long wavelength area that largely contributes to an improvement in color rendering property. By thus employing the two types of red fluorescent substances, it is possible to broaden an emission spectral range of a red component. This makes it possible to achieve a high color rendering property. Moreover, by thus employing the two types of red fluorescent substances, it is possible to achieve a high color rendering property while retaining a luminous efficiency.

Embodiment 5

Figure 20:
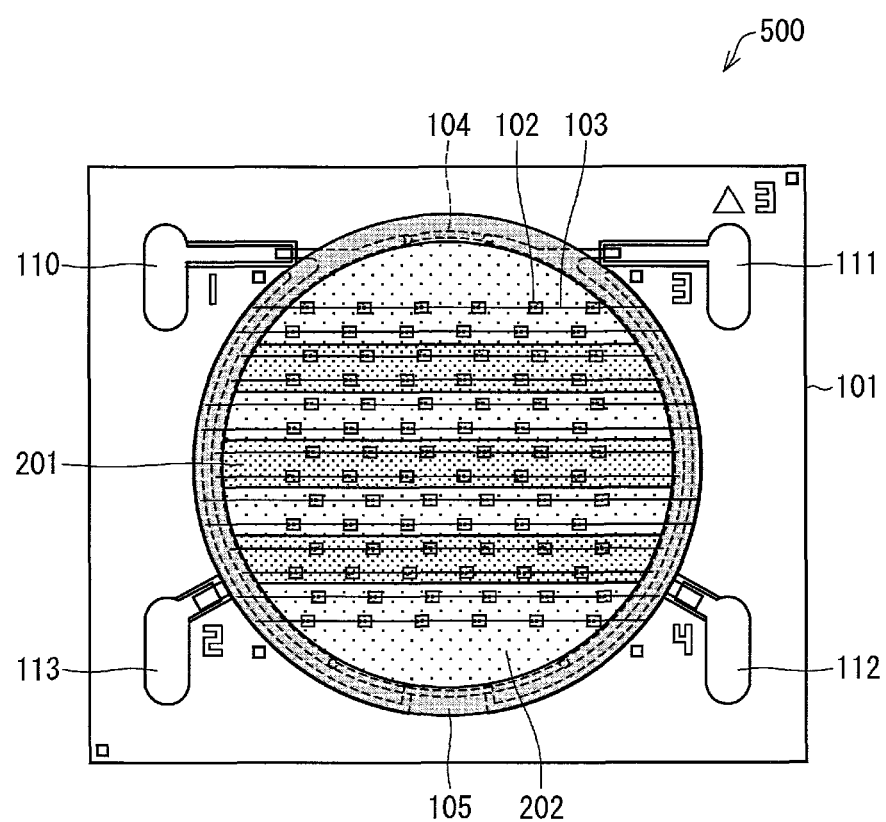
FIG. 20 is a plan view illustrating an example configuration of a light-emitting device in accordance with another embodiment of the present invention.
Figure 21:
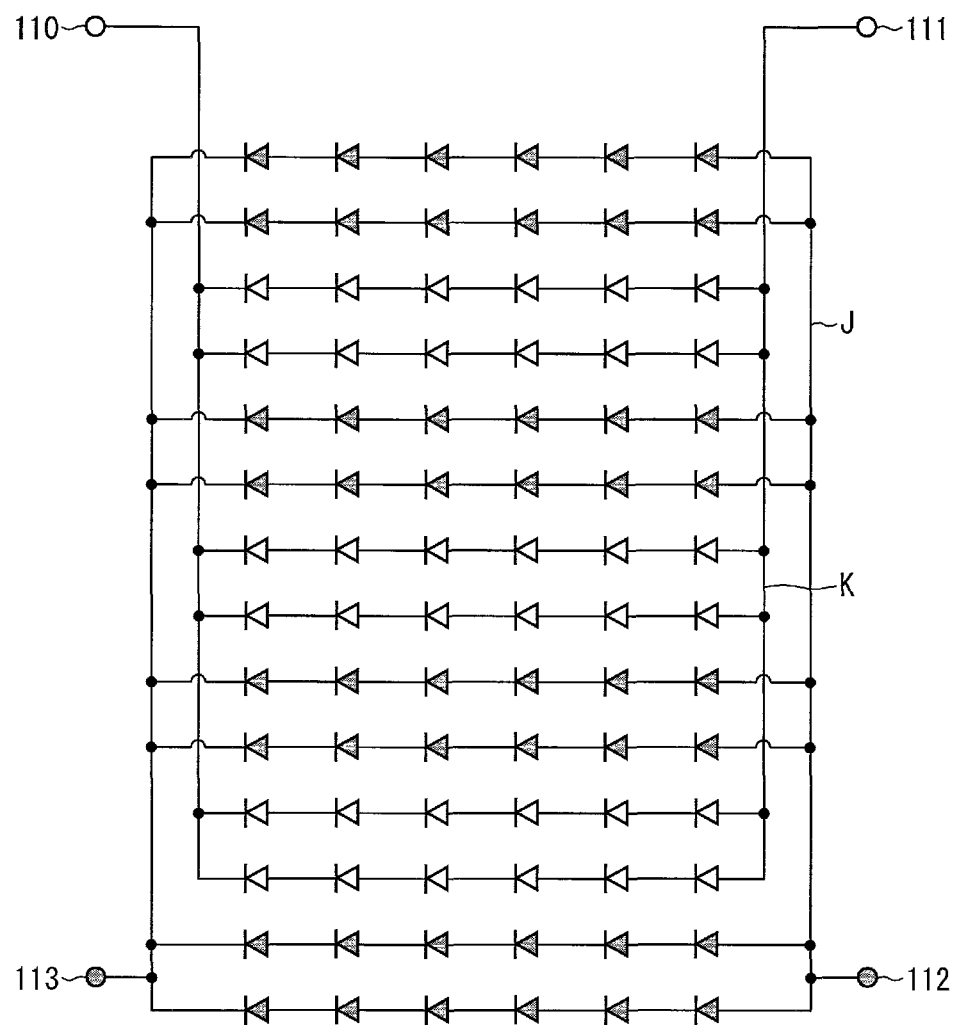
FIG. 21 is a view illustrating a circuit configuration of LED chips in the light-emitting device illustrated in FIG. 20.
Figure 22:
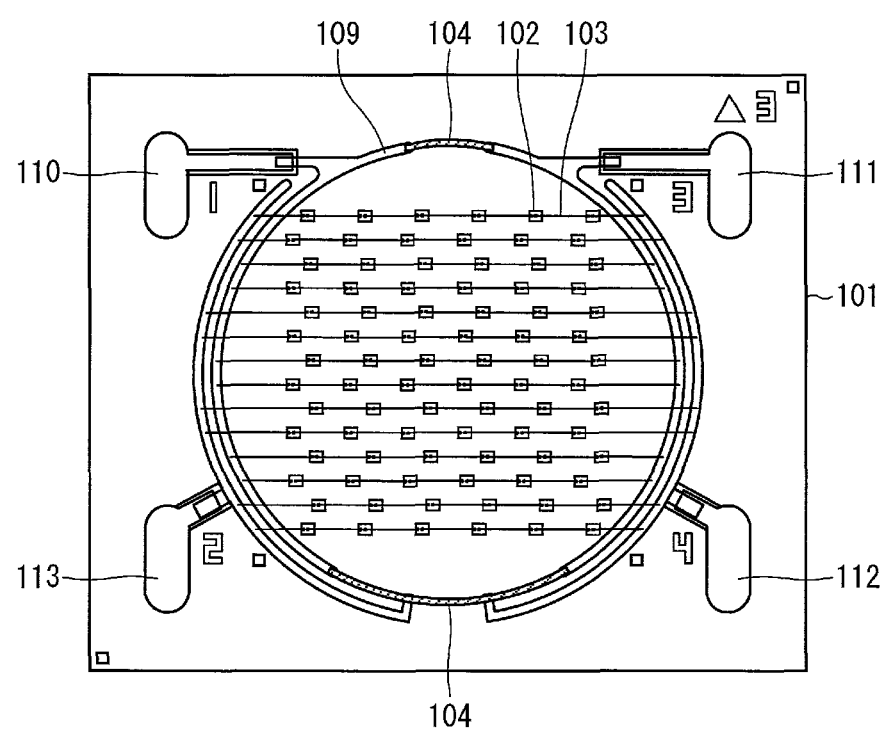
FIG. 22 is a plan view illustrating a configuration in which LED chips are provided in manufacturing the light-emitting device illustrated in FIG. 20.

FIG. 20 is a plan view illustrating a configuration example of a light-emitting device 500 in accordance with Embodiment 5. FIG. 21 is a view illustrating a circuit configuration of LED chips 102 in the light-emitting device 500. FIG. 22 is a plan view illustrating a configuration in which the LED chips 102 are provided in manufacturing the light-emitting device 500.

The light-emitting device 500 of Embodiment 5 has a configuration which is substantially identical with that of the light-emitting device 200 of Embodiment 2, except for the following points.

That is, the light-emitting device 500 includes a plurality of LED chips 102 which are electrically connected with each other as illustrated in FIG. 21. The light-emitting device 500 includes (i) a series-parallel circuit section in which 48 LED chips 102 are connected with each other in a series-parallel manner (i.e., 8 parallel lines in each of which 6 LED chips are connected in series) and (ii) a series-parallel circuit section in which 36 LED chips 102 are connected with each other in a series-parallel manner (i.e., 6 parallel lines in each of which 6 LED chips are connected in series). Hereinafter, the series-parallel circuit section including the 48 LED chips 102 is referred to as "series-parallel circuit section J" and the series-parallel circuit section including the 36 LED chips 102 is referred to as "series-parallel circuit section K".

In accordance with a circuit configuration illustrated in FIG. 21, a wiring line 109 on the substrate 101 is arranged in a pattern as illustrated in FIG. 22. The LED chips 102 are connected with each other via the wires 103 and the LED chips 102 are connected with the wiring line 109 via the wires 103 so that the series-parallel circuit sections J and K are formed. An arrangement itself of the LED chips 102 is substantially identical with that of the LED chips 102 in the light-emitting device 200.

The light-emitting device 500 includes two printed resistor elements 104 (see FIG. 22). One of the two printed resistor elements 104 is connected in parallel with the series-parallel circuit section J, and the other of the printed resistor elements 104 is connected in parallel with the series-parallel circuit section K.

The first fluorescent-substance-containing resin layer 201 is formed as separate layers (i.e., three layers) which seal respective (three) groups of the LED chips 102 of the series-parallel circuit section K. The second fluorescent-substance-containing resin layer 202 is formed as separate layers (i.e., four layers) which seal respective (four) groups of the LED chips 102 of the series-parallel circuit section J. Therefore, the first fluorescent-substance-containing resin layer 201 and the second fluorescent-substance-containing resin layer 202 are arranged to form a striped pattern in the area inside the first resin dam 105 in the plan view.

The first particulate fluorescent substance of the first fluorescent-substance-containing resin layer 201 is a green fluorescent substance, which is a $Ca_3(Sc.Mg)_2Si_3O_{12}:Ce$ fluorescent substance. The second particulate fluorescent substance is a red fluorescent substance, which is a $CaAlSiN_3:Eu$ fluorescent substance.

This allows the area, in which the first fluorescent-substance-containing resin layer 201 is formed, to serve as a light-emitting section (first light-emitting section) which emits blue light and green light by the blue LEDs and the green fluorescent substance. Further, the area, in which the second fluorescent-substance-containing resin layer 202 is formed, serves as a light-emitting section (second light-emitting section) which emits blue light and red light by the blue LEDs and the red fluorescent substance.

By thus changing a circuit configuration of the LED chips 102 and a type of fluorescent substance, a controllable degree of a color rendering property and a light emission intensity is broadened.

Embodiment 6

Figure 24:
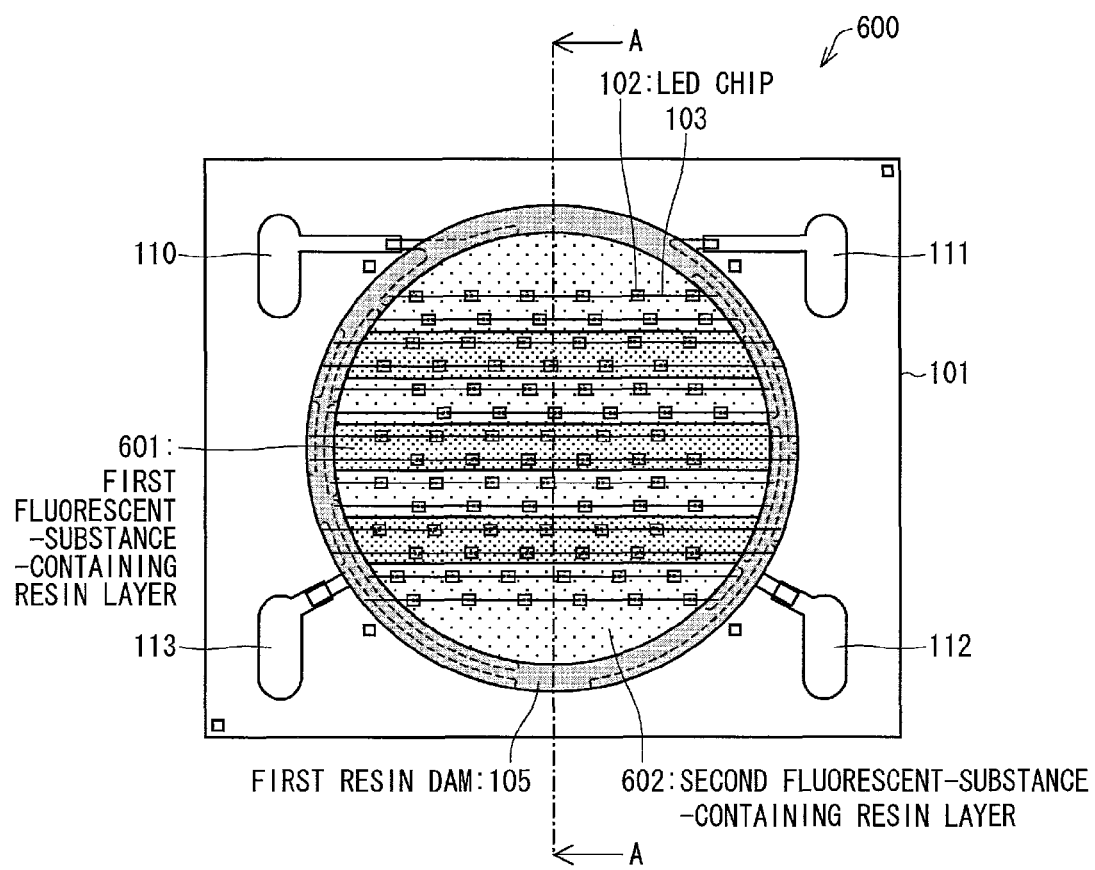
FIG. 24 is a plan view illustrating an example configuration of a light-emitting device in accordance with another embodiment of the present invention.
Figure 25:
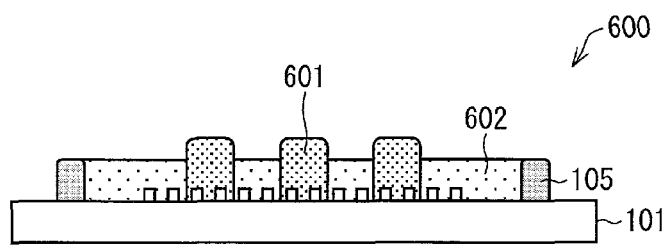
FIG. 25 is a cross-sectional view taken along the line A-A of FIG. 24.

FIG. 24 is a plan view illustrating an example configuration of a light-emitting device 600 in accordance with Embodiment 6. FIG. 25 is a cross-sectional view of the light-emitting device 600 taken along the line A-A of FIG. 24.

The light-emitting device 600 of Embodiment 6 has a configuration similar to that of the light-emitting device 200 of Embodiment 2, except that the light-emitting device 600 includes a first fluorescent-substance-containing resin layer 601 and a second fluorescent-substance-containing resin layer 602 instead of the first fluorescent-substance-containing resin layer 201 and the second fluorescent-substance-containing resin layer 202. That is, the light-emitting device 600 includes a substrate 101, LED chips 102, a first resin dam 105, a first fluorescent-substance-containing resin layer 601 (resin layer), and a second fluorescent-substance-containing resin layer 602 (resin layer) (see FIG. 24).

In Embodiment 6, the LED chips 102, the first resin dam 105, the first fluorescent-substance-containing resin layer 601, and the second fluorescent-substance-containing resin layer 602 are provided on an upper surface of the substrate 101. The first fluorescent-substance-containing resin layer 601 and the second fluorescent-substance-containing resin layer 602 are formed in an area inside the first resin dam 105.

The first fluorescent-substance-containing resin layer 601 is a sealing resin layer which is made of a resin containing a first particulate fluorescent substance. The first fluorescent-substance-containing resin layer 601 is formed in the area inside the first resin dam 105 so that corresponding LED chips 102 and wires 103 are embedded in the first fluorescent-substance-containing resin layer 601. In the arrangement, the first fluorescent-substance-containing resin layer 601 is formed as three belts in the plan view.

The second fluorescent-substance-containing resin layer 602 is a sealing resin layer made of a resin containing a second particulate fluorescent substance. The second fluorescent-substance-containing resin layer 602 is provided in the area inside the first resin dam 105 so that corresponding LED chips 102 and wires 103 are embedded in the second fluorescent-substance-containing resin layer 602. In the arrangement, the second fluorescent-substance-containing resin layer 602 is formed as four belts in the plan view.

Therefore, the first fluorescent-substance-containing resin layer 601 and the second fluorescent-substance-containing resin layer 602 are arranged to form a striped pattern (in this case, lateral stripes) in the area inside the first resin dam 105 in the plan view. In other words, the first fluorescent-substance-containing resin layer 601 and the second fluorescent-substance-containing resin layer 602 are formed in a planar shape identical with that of the first fluorescent-substance-containing resin layer 201 and the second fluorescent-substance-containing resin layer 202 in the light-emitting device 200 of Embodiment 2.

The first particulate fluorescent substance contained in the first fluorescent-substance-containing resin layer 601 and the second particulate fluorescent substance contained in the second fluorescent-substance-containing resin layer 602 are not limited, provided that (i) the first particulate fluorescent substance is different from the second particulate fluorescent substance and (ii) the light-emitting device 100 can emit light of a predetermined color (chromaticity) by combining the color of light emitted by the LED chips 102 and colors of the respective first and second particulate fluorescent substances.

Here, as illustrated in FIG. 25, the first fluorescent-substance-containing resin layer 601 and the second fluorescent-substance-containing resin layer 602 are formed so that a surface of a resin part of the first fluorescent-substance-containing resin layer 601 becomes higher than a surface of a resin part of the second fluorescent-substance-containing resin layer 602 (hereinafter, the surface of the resin part is referred to as "surface resin section"). That is, a height of the surface resin section of the first fluorescent-substance-containing resin layer 601 is larger than a height of the surface resin section of the second fluorescentsubstance-containing resin layer 602. Note that a height of a surface resin section of the first resin dam 105 is smaller than the height of the surface resin section of the first fluorescent-substance-containing resin layer 601 and is larger than the height of the surface resin section of the second fluorescent-substance-containing resin layer 602.

According to the light-emitting device 600, after the first resin dam 105 is formed by a manufacturing method similar to that of the light-emitting device 200 of Embodiment 2 (i.e., after the step of forming first resin dam), the first fluorescent-substance-containing resin layer 601 and the second fluorescent-substance-containing resin layer 602 are formed on the upper surface of the substrate 101 in this order, as with the step of forming the first fluorescent-substance-containing resin layer 201 and the second fluorescent-substance-containing resin layer 202 of the light-emitting device 200.

Specifically, first, a fluorescent particle containing resin in which the first particulate fluorescent substance is dispersed in a transparent silicone resin is provided in a predetermined location so that the first fluorescent-substance-containing resin layer 601 is formed. In this case, the first fluorescent-substance-containing resin layer 601 is formed so as to be higher than the surface resin section of the first resin dam 105.

In this case, the silicone resin of the first fluorescent-substance-containing resin layer 601 has a high thixotropy and no fluidity. The "thixotropy" is a property of having high viscosity in a normal state but being less viscid only while being agitated. By thus configuring the first fluorescent-substance-containing resin layer 601 with the use of a resin having thixotropy (viscosity) higher than that of the second fluorescent-substance-containing resin layer 602, it is not necessary to thermally harden the first fluorescent-substance-containing resin layer 601 at this point.

The first fluorescent-substance-containing resin layer 601 serves as a so-called resin dam (resin wall) for forming the second fluorescent-substance-containing resin layer 602. That is, the first fluorescent-substance-containing resin layer 601 can be used as a dam member without being hardened. The second fluorescent-substance-containing resin layer 602 is formed between the dams formed by the first fluorescent-substance-containing resin layer 601.

Subsequently, a fluorescent particle containing resin in which the second particulate fluorescent substance is dispersed in a transparent liquid silicone resin is poured so as to fill areas (i.e., four areas in total) surrounded by the first resin dam 105 and the first fluorescent-substance-containing resin layer 601. Then, the fluorescent particle containing resin is thermally hardened so that the second fluorescent-substance-containing resin layer 602 is formed. At this time, the first fluorescent-substance-containing resin layer 601 is simultaneously hardened.

Note that the silicone resin of the second fluorescent-substance-containing resin layer 602 has a low thixotropy and a fluidity. The thixotropy of the second fluorescent-substance-containing resin layer 602 is quite lower than that of the first fluorescent-substance-containing resin layer 601, and can be substantially zero or can be zero. The liquid fluorescent particle containing resin for forming the second fluorescent-substance-containing resin layer is poured so that the height of the second fluorescent-substance-containing resin layer does not exceed the surface resin section of the first resin dam 105.

As such, the light-emitting device 600 illustrated in FIGS. 24 and 25 can be produced. According to the light-emitting device 600, it is possible to separately control a light emission from the first fluorescent-substance-containing resin layer 601 and a light emission from the second fluorescent-substance-containing resin layer 602 by supplying electric power via external terminals which are connected with the respective electrode lands 110 through 113.

According to the light-emitting device 600, the first fluorescent-substance-containing resin layer 601 is making contact with the second fluorescent-substance-containing resin layer 602, and accordingly the light emission surfaces are arranged close to each other. Moreover, the first fluorescent-substance-containing resin layer 601 and the second fluorescent-substance-containing resin layer 602 are alternately arranged in a width direction (in short intervals). Therefore, a plurality of boundaries (stripes) of the light emission surfaces are to be formed in the entire area inside the first resin dam 105. Therefore, in a case where the light sources are directly viewed, the light sources are more likely to be viewed as a single light-emitting point of a mixed color, and this allows (i) a separation between the light-emitting points and (ii) a separation between emission light colors to be hardly recognized.

Each of the light-emitting sections is configured to emit at least one color of light, which color is different from that of light emitted from the other of the light-emitting sections. This makes it possible to obtain light whose color is obtained by mixing at least two colors. As such, it is possible to easily adjust a chromaticity of light emitted by the entire light-emitting device. This makes it possible to easily obtain a high color rendering property, depending on a combination of colors of lights emitted from the light-emitting sections.

Therefore, according to the light-emitting device 600, it is possible to obtain a higher mixed color performance as compared with a conventional technique, and it is also possible to easily emit light whose color can be easily adjusted and which has a high color rendering properly.

According to the light-emitting device 600, the surface resin section of the first fluorescent-substance-containing resin layer 601 having the high thixotropy is located higher than the surface resin section of the second fluorescent-substance-containing resin layer 602 whose thixotropy is lower than that of the first fluorescent-substance-containing resin layer 601. In other words, boundaries between the resin layers are substantially clearly defined.

According to the configuration, when the resin layers are formed in the respective light-emitting sections, the fluorescent substances of respective of the first fluorescent-substance-containing resin layer 601 and the second fluorescent-substance-containing resin layer 602 are not mixed with each other. This makes it possible to generate and reproduce an accurate emission light color.

Moreover, the first fluorescent-substance-containing resin layer 601 serves as a further complete resin dam (resin wall) for forming the second fluorescent-substance-containing resin layer 602. Further, the first fluorescent-substance-containing resin layer 601 can be used as a dam member without being hardened.

In a case where a fluorescent-substance-containing resin layer that has a large area is formed, it is preferable to use a resin that has a low thixotropy and a fluidity. In view of this, according to the light-emitting device 600 of Embodiment 6, the second fluorescent-substance-containing resin layer 602 preferably has (i) a thixotropy lower than that of the first fluorescent-substance-containing resin layer 601 and (ii) a fluidity.

Embodiment 7

Figure 26:
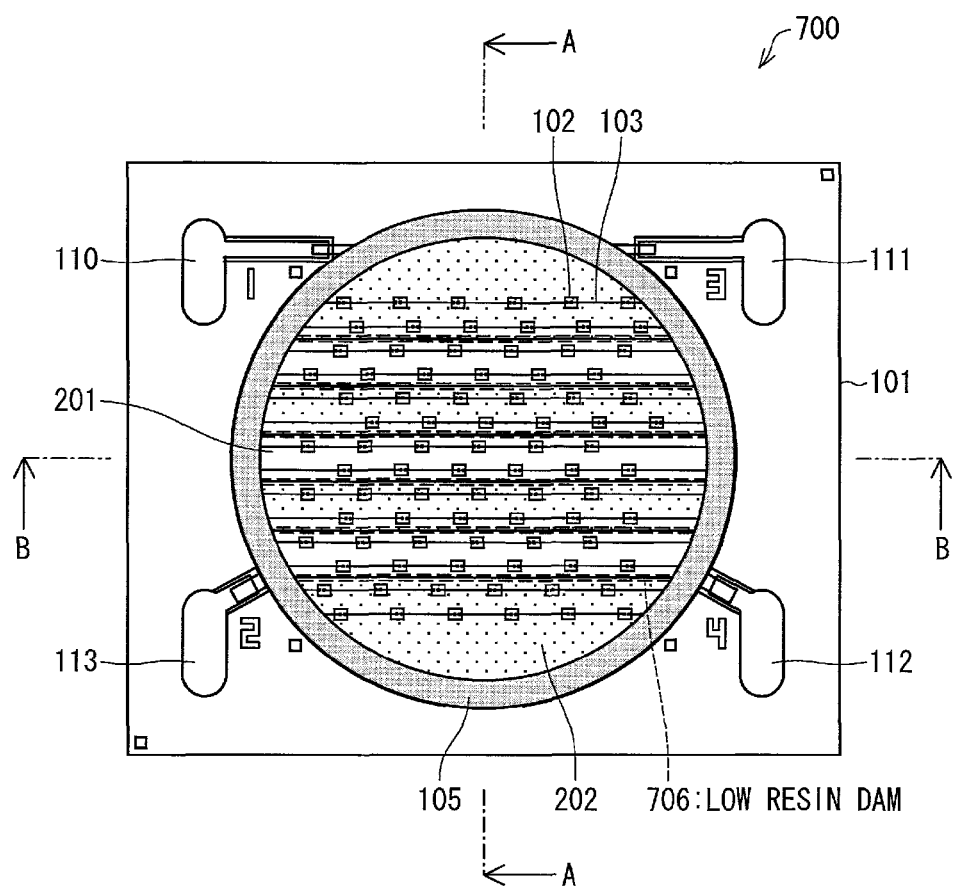
FIG. 26 is a plan view illustrating an example configuration of a light-emitting device in accordance with another embodiment of the present invention.

FIG. 26 is a plan view illustrating an example configuration of a light-emitting device 700 in accordance with Embodiment 7. The light-emitting device 700 at least includes a substrate 101, a ring shaped first resin dam 105, at least one low resin dam 706, LED chips 102, a first fluorescent-substance-containing resin layer 201, a second fluorescent-substance-containing resin layer 202, electrode lands 111 and 113 which serve as respective anode electrodes, and electrode lands 110 and 112 which serve as respective cathode electrodes (see FIG. 26).

Figure 27:
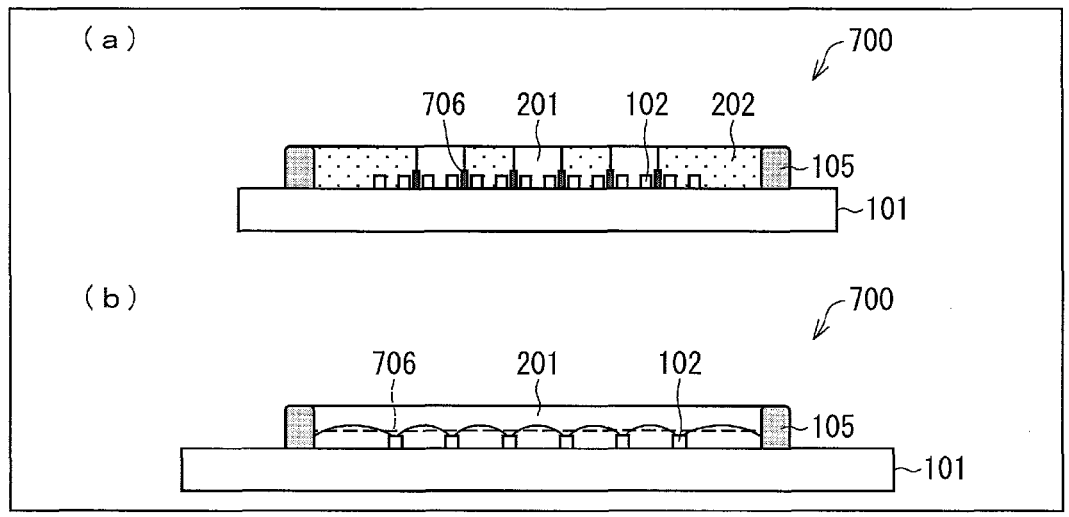
FIG. 27 is a cross-sectional view. (a) of FIG. 27 illustrates a cross section of the light-emitting device taken along the line A-A of FIG. 26. (b) of FIG. 27 illustrates a cross section of the light-emitting device taken along the line B-B of FIG. 26.

(a) of FIG. 27 illustrates an A-A cross section of the light-emitting device 700, and (b) of FIG. 27 illustrates a B-B cross section of the light-emitting device 700. In this case, in order to clarify a relation between the first resin dam 105 and the low resin dams 706, a fluorescent substance and the like are not depicted in the drawings. FIG. 27 illustrates a configuration in which a plurality of low resin dams 706 are formed on the substrate 101 and the low resin dams 706 have a height smaller than that of the ring-shaped first resin dam 105.

(First Resin Dam 105)

The first resin dam 105 is a ring-shaped resin dam made of a white resin and is formed with the use of a dispenser. The first resin dam 105 is preferably formed so as to at least partially cover a wiring pattern.

(Low Resin Dam 706)

Each of the low resin dams 706 is formed in a substantially straight line shape with the use of a dispenser so as to extend across an area surrounded by the first resin dam 105. Note that the low resin dams 706 do not need to be continuously formed. The low resin dams 706 are preferably formed so as to at least partially cover the wiring pattern.

(Forming First Resin Lateral Stripes)

The first fluorescent-substance-containing resin layer 201, which form first resin lateral stripes, is formed by mixing a red fluorescent substance and a silicone resin which is a sealing material. The silicone resin used in the first fluorescent-substance-containing resin layer 201 has a high thixotropy and no fluidity.

(Second Fluorescent-Substance-Containing Resin 202)

After forming the first fluorescent-substance-containing resin layer 201, the second fluorescent-substance-containing resin layer 202 containing a green fluorescent substance and a red fluorescent substance is formed as second resin lateral stripes. Since the low resin dams 706 have been formed, it is possible to inhibit light, which is emitted from the first fluorescent-substance-containing resin layer 201, from traveling toward adjacent stripes of the second fluorescent-substance-containing resin 202. This makes it possible to inhibit color mixture between the respective first and second fluorescent-substance-containing resin layers.

Here, the second fluorescent-substance-containing resin layer 202 can have (i) a thixotropy lower than that of the first fluorescent-substance-containing resin layer 201 and (ii) a fluidity. The low resin dams 706 serve as so-called resin dams (resin walls). This prevents the first fluorescent-substance-containing resin layer 201 from being mixed with the second fluorescent-substance-containing resin layer 202, in other words, boundaries between the resin layers are defined further clearly.

As such, the low resin dams 706 have a height smaller than that of the first resin dam 105. This allows an increase in mixed color performance, as compared to, for example, the light-emitting device 100 illustrated in FIG. 1. Note that, in the light-emitting device 100, it is possible to form the second resin dam 106 so as to have a height smaller than that of the first resin dam 105.

Embodiment 8

Figure 28:
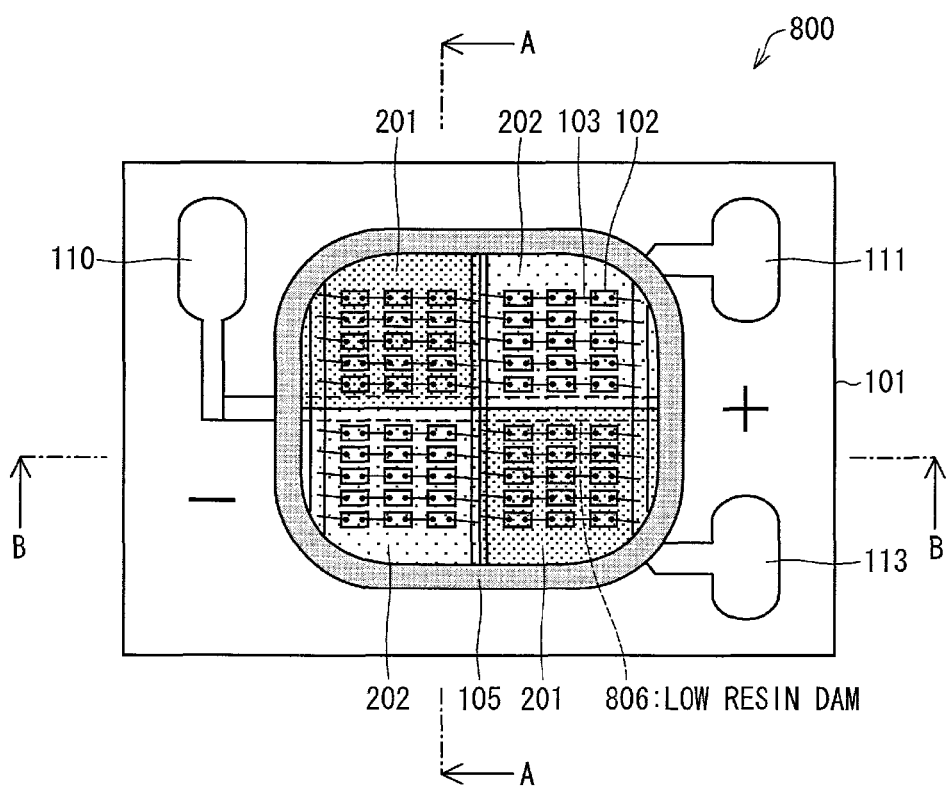
FIG. 28 is a plan view illustrating an example configuration of a light-emitting device in accordance with another embodiment of the present invention.

FIG. 28 is a plan view illustrating an example configuration of a light-emitting device 800 in accordance with Embodiment 8. The light-emitting device 800 at least includes a ceramic substrate 101, a first resin dam 105, a low resin dam 806, LED chips 102, a first fluorescent-substance-containing resin layer 201, a second fluorescent-substance-containing resin layer 202, electrode lands 111 and 113 which serve as respective anode electrodes, and an electrode land 110 which serves as a cathode electrode (see FIG. 28).

Figure 29:
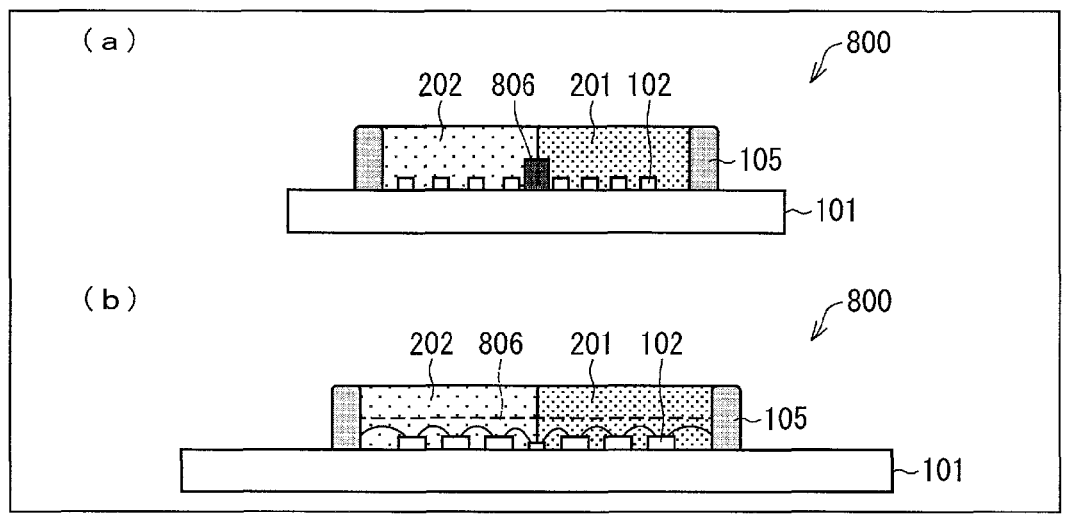
FIG. 29 is a cross-sectional view. (a) of FIG. 29 illustrates a cross section of the light-emitting device taken along the line A-A of FIG. 28. (b) of FIG. 29 illustrates a cross section of the light-emitting device taken along the line B-B of FIG. 28.

(a) of FIG. 29 illustrates an A-A cross section of the light-emitting device 800, and (b) of FIG. 29 illustrates a B-B cross section of the light-emitting device 800. FIG. 29 illustrates a configuration in which the low resin dam 806 has a height smaller than that of the ring-shaped first resin dam 105. That is, the low resin dam 806 is formed to have the height that does not interfere with a mixed color performance.

In this case, it is possible to provide a plurality of first fluorescent-substance-containing resin layers and a plurality of second fluorescent-substance-containing resin layers. Alternatively, it is possible to provide resin layers which contain respective different fluorescent substances. Moreover, a plurality of low resin dams 806 can be provided.

First, the first fluorescent-substance-containing resin layer 201 is formed from a silicone resin which has a high thixotropy and no fluidity, and then the second fluorescent-substance-containing resin layer 202 having a low thixotropy is formed between the first fluorescent-substance-containing resin layer 201 and the first resin dam 105.

The low resin dam 806 can be formed in a cross shape in the plan view. In this case, the low resin dam 806 is to divide the area surrounded by the first resin dam 105 into four areas. It is preferable that the first fluorescent-substance-containing resin layer 201 is formed in catercorner two of the four areas, and the second fluorescent-substance-containing resin layer 202 is formed in the other catercorner two of the four areas, as illustrated in FIG. 28.

Embodiment 9

Figure 30:
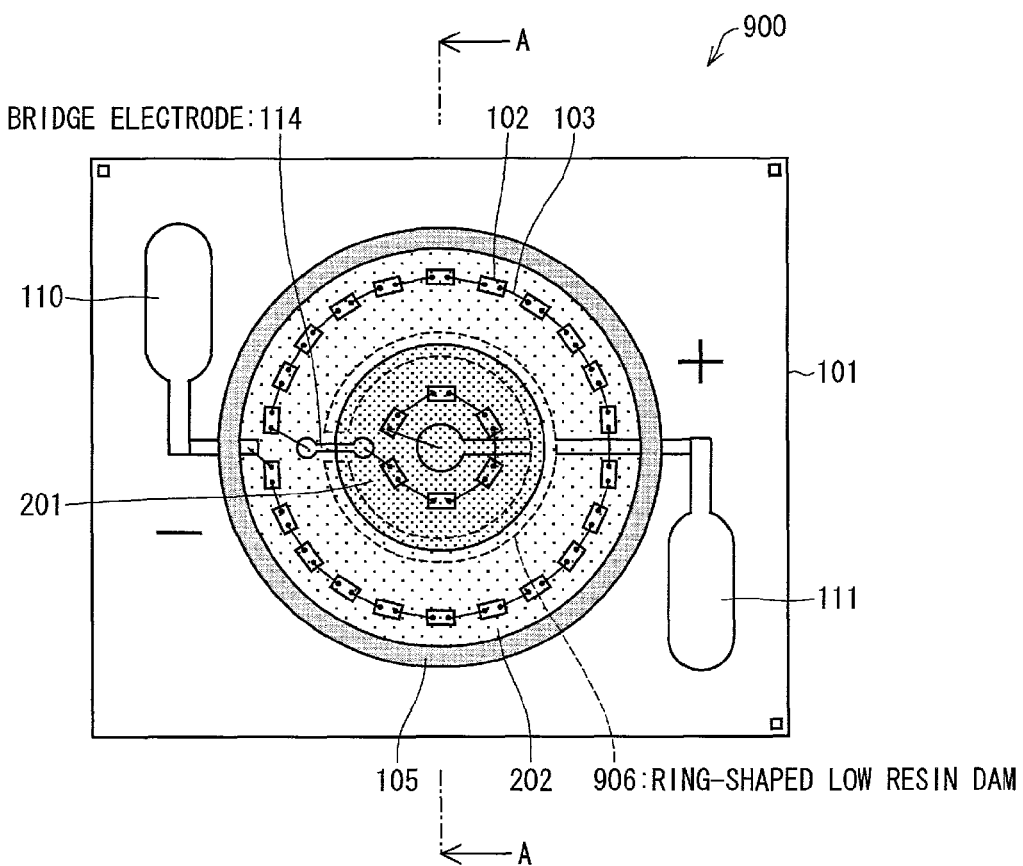
FIG. 30 is a plan view illustrating an example configuration of a light-emitting device in accordance with another embodiment of the present invention.

FIG. 30 is a plan view illustrating an example configuration of a light-emitting device 900 in accordance with Embodiment 9. The light-emitting device 900 at least includes a ceramic substrate 101, a ring-shaped first resin dam 105, a ring-shaped low resin dam 906, LED chips 102, a first fluorescent-substance-containing resin layer 201, a second fluorescent-substance-containing resin layer 202, an electrode land 111 which serves as an anode electrode, an electrode land 110 which serves as a cathode electrode, and a bridge electrode 114 (see FIG. 30).

The ring-shaped low resin dam 906 is provided inside the ring-shaped first resin dam 105 (see FIG. 30). Further, the first fluorescent-substance-containing resin layer 201 is formed inside the ring-shaped low resin dam 906, and the second fluorescent-substance-containing resin layer 202 is provided outside the ring-shaped low resin dam 906.

Figure 31:
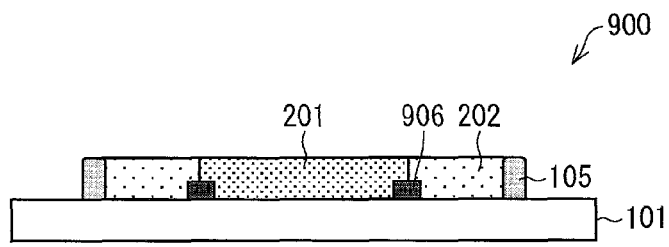
FIG. 31 is a cross-sectional view of the light-emitting device taken along the line A-A of FIG. 30.

FIG. 31 illustrates an A-A cross section of the light-emitting device 900. As illustrated in FIG. 31, the ring-shaped low resin dam 906 has a height smaller than that of the ring-shaped first resin dam 105. In order for FIG. 31 to be easily viewed, the LED chips 102 and the like are not depicted in FIG. 31.

The ring-shaped low resin dam 906 is not formed in an area in which the bridge electrode 114 is formed (see FIG. 30). As such, the ring-shaped low resin dam 906 does not necessarily need to be continuously formed. The ring-shaped low resin dam 906 is not formed above the bridge electrode 114, and therefore the resin does not make contact with a bonding part. This makes it possible to carry out wire bonding in good condition. That is, it is possible to prevent the looped wire from making contact with the resin, and it is therefore possible to reduce a breakage of the loop.

Here, the first fluorescent-substance-containing resin layer 201 is formed from a silicone resin that has a high thixotropy and no fluidity. Moreover, the first fluorescent-substance-containing resin layer 201 is surrounded by the second fluorescent-substance-containing resin layer 202.

In the light-emitting device 900, only one ring-shaped low resin dam 906 is formed. Note, however, that it is of course possible to form (i) a plurality of ring-shaped low resin dams 906 and (ii) resin layers containing respective different fluorescent substances inside the respective plurality of ring-shaped low resin dams 906.

Embodiment 10

In Embodiment 10, an example will be described with regard to an LED light bulb (LED lighting device, LED lighting apparatus) that has a wide light-distribution characteristic and can control color.

Figure 32:
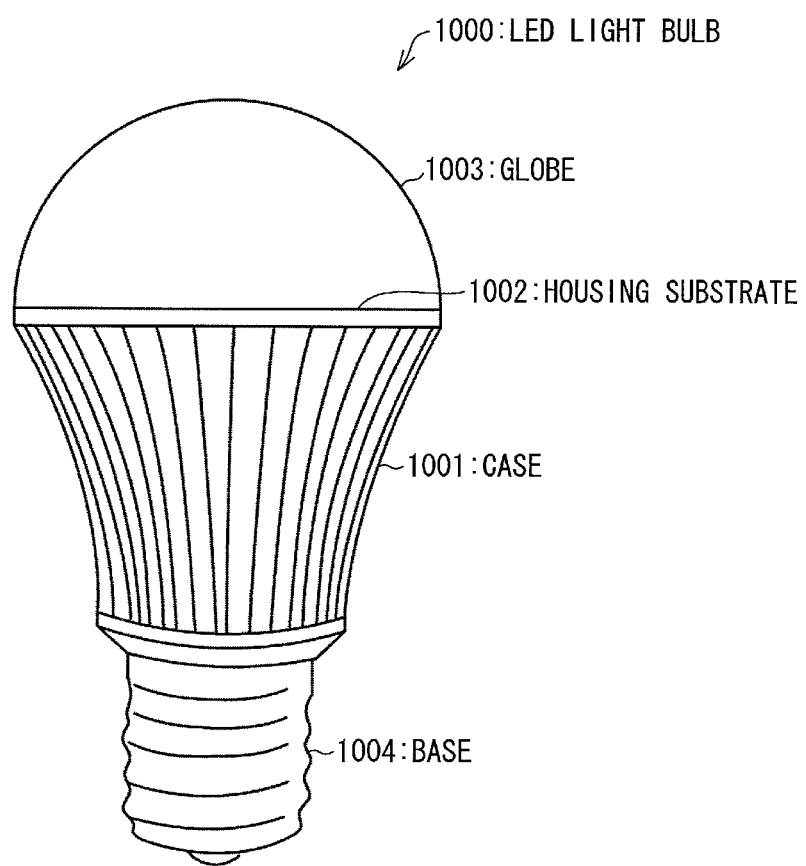
FIG. 32 is a lateral view illustrating an example configuration of an LED light bulb in accordance with an embodiment of the present invention.

FIG. 32 is a lateral view illustrating an example configuration of an LED light bulb 1000 in accordance with Embodiment 10. The LED light bulb 1000 includes a heat sink 1001, a housing substrate 1002, a base 1004, and a globe 1003 (see FIG. 32).

The heat sink 1001 has an inverted circular truncated conic shape and serves also as a case for containing a power source circuit. The housing substrate 1002 is fixed on top of the heat sink 1001.

The housing substrate 1002 has a circular shape in a plan view. The globe 1003 is mounted on one of surfaces (i.e., mounting surface) of the housing substrate 1002.

The globe 1003 is a resin cover which is a semitransparent domical light diffusion member having a function to diffuse light. The globe 1003 is fixed to the housing substrate 1002 so as to cover the mounting surface of the housing substrate 1002.

FIG. 33 is a plan view illustrating the LED light bulb 1000 on which the globe 1003 is not provided. As illustrated in FIG. 33, the light-emitting device 200 illustrated in FIG. 8 is provided on the housing substrate 1002.

Inside the heat sink 1001, a power source circuit is provided (not illustrated), and the power source circuit is connected with the light-emitting device 200 via (i) external connectors 1010 through 1013 which are provided in a periphery of the mounting surface of the housing substrate 1002 and (ii) land electrodes 1020 through 1023 provided on the housing substrate 1002.

The external connectors 1010 through 1013 are separately formed for the respective electrode lands 110 through 113 of the light-emitting device 200. Specifically, the external connector 1010 is electrically connected with the electrode land 110 which serves as a cathode for the second fluorescent-substance-containing resin layer 202. The external connector 1011 is electrically connected with the electrode land 111 which serves as an anode for the first fluorescent-substance-containing resin layer 201. The external connector 1012 is electrically connected with the electrode land 112 which serves as a cathode for the first fluorescent-substance-containing resin layer 201. The external connector 1013 is electrically connected with the electrode land 113 which serves as an anode for the second fluorescent-substance-containing resin layer 202. According to the arrangement, an external connector configuration is formed which allows the first fluorescent-substance-containing resin layer 201 and the second fluorescent-substance-containing resin layer 202 to separately emit light. Note that the external connectors 1010 through 1013 serve also as members for fixing the light-emitting device 200 to the housing substrate 1002.

In order to supply electric power from an external power source to the power source circuit, the base 1004, which is integrated with the heat sink 1001, is provided on a side opposite to the globe 1003.

In order to control the first fluorescent-substance-containing resin layer 201 and the second fluorescent-substance-containing resin layer 202 to separately emit light, a color/light controlling circuit (not illustrated) is provided together with the power source circuit. A light controlling signal is wirelessly transmitted separately from a controller (remote controller) of the LED light bulb 1000 so that a color and/or light can be controlled with the use of the controller. Alternatively, instead of such a wireless system, it is possible to employ a system in which the base 1004 has four terminals so that electric power is supplied and a color controlling signal is received via the terminals of the base 1004. Alternatively, it is possible to employ a configuration in which a LAN cable is provided as a signal line for supplying a color controlling signal and a light controlling signal. In such a case, the LED light bulb 1000 can have a LAN port.

Alternatively, the controller can be integrated with the LED light bulb 1000. The first fluorescent-substance-containing resin layer 201 is configured to contain a fluorescent substance(s) so as to emit light whose color temperature is 2700 K (warm color, further reddish light) when only the first fluorescent-substance-containing resin layer 201 is controlled to emit light. The second fluorescent-substance-containing resin layer 202 is configured to contain a fluorescent substance(s) so as to emit light whose color temperature is 5700 K (cold color, light with further white) when only the second fluorescent-substance-containing resin layer 202 is controlled to emit light.

Figure 34:
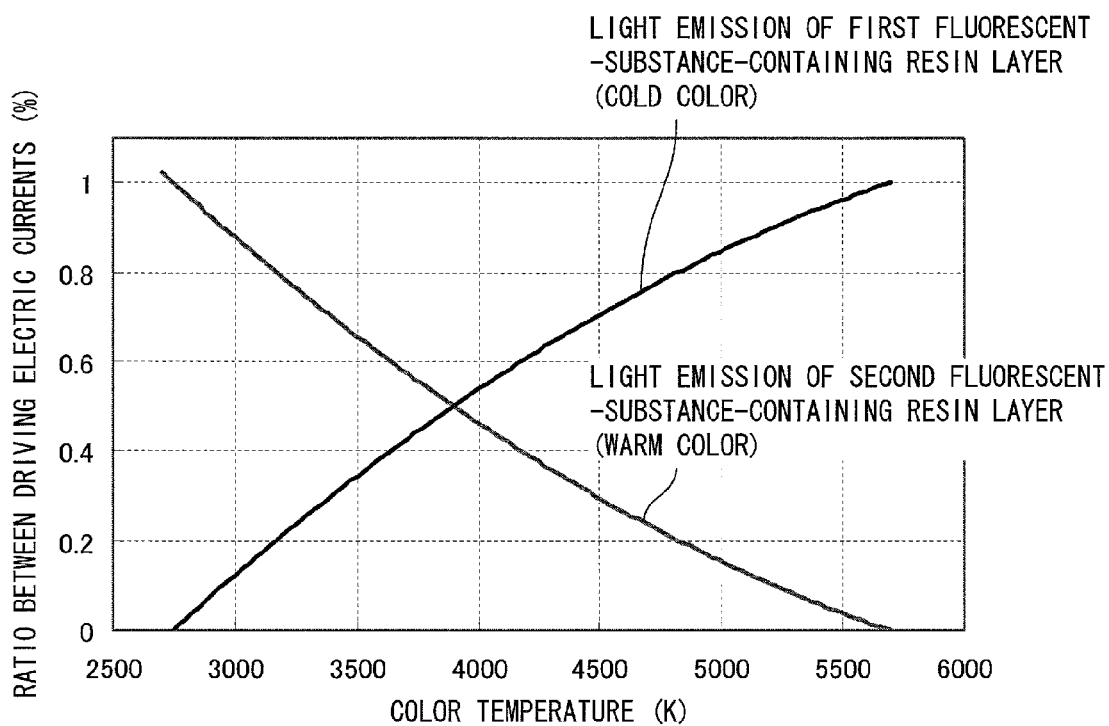
FIG. 34 is a view illustrating a color temperature of the LED light bulb with respect to a ratio between driving electric currents for causing respective of a first fluorescent-substance-containing resin layer and a second fluorescent-substance-containing resin layer to emit light.

The following description will discuss a condition of controlling a color of the LED light bulb 1000. FIG. 34 is a view illustrating a color temperature (CCT) of the LED light bulb 1000 with respect to a ratio between driving electric currents (i.e., forward currents) for causing respective of the first fluorescent-substance-containing resin layer 201 and the second fluorescent-substance-containing resin layer 202. Note that a driving electric current is constant, i.e., 700 mA. In order to simply describe the configuration, FIG. 34 illustrates a graph of (i) a ratio between driving electric currents for respective of the first fluorescent-substance-containing resin layer 201 and the second fluorescent-substance-containing resin layer 202 with respect to (ii) a color temperature of the LED light bulb 1000. In this case, a sum of (i) a ratio of the driving electric current for the first fluorescent-substance-containing resin layer 201 and (ii) a ratio of the driving electric current for the second fluorescent-substance-containing resin layer 202 is 100%. According to the configuration, by changing the driving electric currents supplied via respective channels to the first fluorescent-substance-containing resin layer 201 and the second fluorescent-substance-containing resin layer 202, it is possible to change the color temperature within the range between 2700 K and 5700 K.

As illustrated in FIG. 35, the LED light bulb 1000 of Embodiment 10 is configured to control color of light such that a chromaticity of the light changes along a black-body radiation locus. This allows the light to be seen as natural light for eyes of a human. Note, however, that this does not apply to a case where the LED light bulb 1000 is used in performance lighting or in special lighting. That is, it is possible to obtain an emission light color which does not follow the black-body radiation locus by changing (i) fluorescent substances used in the light-emitting sections or (ii) a combination of the fluorescent substances.

FIG. 36 illustrates photographed mixed colors of respective lights which are viewed through the globe 1003 in a case where color-control driving (2700 K (light bulb color), 3800 K (intermediate color), and 5700 K (daylight color)) is carried out in accordance with FIG. 34. This shows that the colors of light are uniformly mixed.

According to Embodiment 10, the color of light is controlled by sequentially changing the driving electric current ratio between the first fluorescent-substance-containing resin layer 201 and the second fluorescent-substance-containing resin layer 202 by a direct-current driving. Note, however, that the color of light can be controlled by appropriately adjusting a pulse current intensity ratio between the first fluorescent-substance-containing resin layer 201 and the second fluorescent-substance-containing resin layer 202 by a pulse-width modulation driving, instead of the direct-current driving.

According to Embodiment 10, the light-emitting device 200 of Embodiment 2 is employed as a light source. Note, however, that the light-emitting device of any of the other embodiments can be employed as a light source.

According to Embodiment 10, the width of the color temperature falls under the range between 2700 K and 5700 K. Note, however, that it is possible to provide a light-emitting device which can emit light having a color temperature width falling under a range, for example, between 200 K and 5000 K or between 3500 K and 6500 K, by providing three or more light-emitting sections and/or changing (i) fluorescent substances used in the light-emitting sections or (ii) a combination of the fluorescent substances.

Embodiment 11

In Embodiment 11, an example will be described with regard to an LED lighting device that is used as a spot lighting device whose light distribution angle is small (e.g., 35° or smaller).

Figure 37:
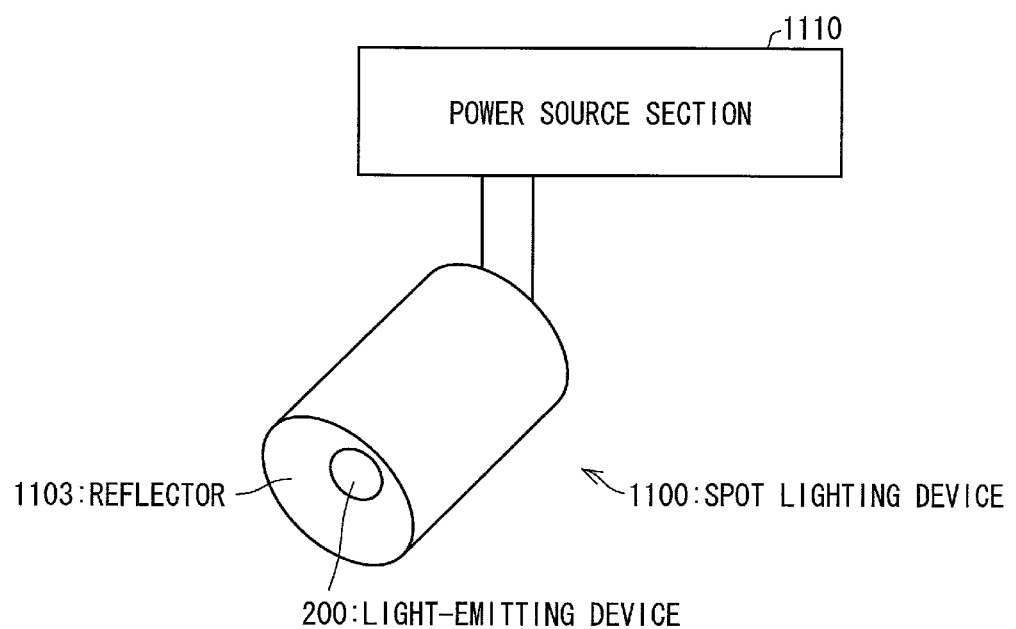
FIG. 37 is a perspective view illustrating an example configuration of a spot lighting device in accordance with an embodiment of the present invention.

FIG. 37 is a perspective view illustrating an appearance of a spot lighting device 1100 in accordance with Embodiment 11. The spot lighting device 1100 is connected with a power source section 1110 which is embedded in, for example, a ceiling (see FIG. 37).

Figure 38:
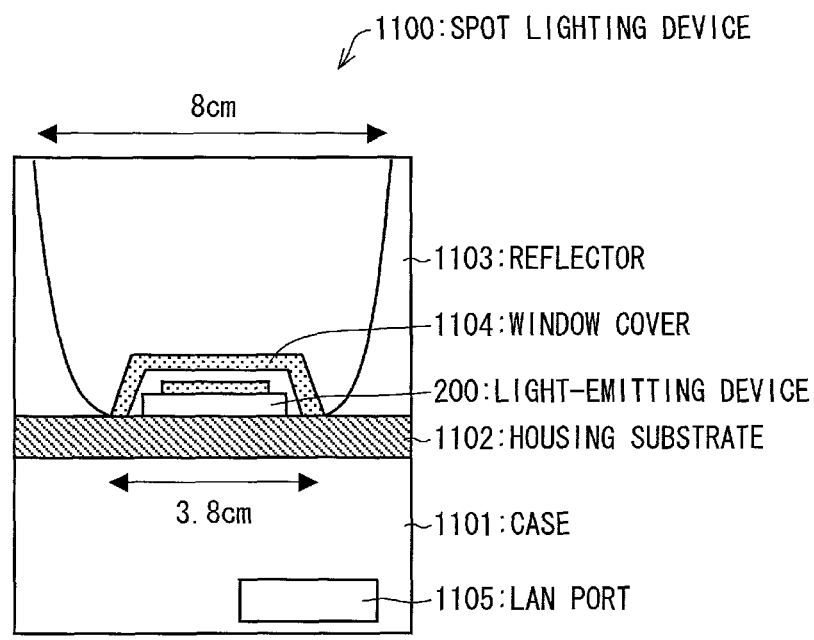
FIG. 38 is a cross-sectional view of the spot lighting device.

FIG. 38 is a cross-sectional view illustrating an example configuration of the spot lighting device 1100 of Embodiment 11. The spot lighting device 1100 includes a case 1101, a housing substrate 1102, a reflector 1103, a window cover 1104, and a light-emitting device 200 (see FIG. 38). The light-emitting device 200 is identical with the light-emitting device 200 illustrated in FIG. 8.

The case 1101 has a heat sink inside of which a power source circuit is contained. The housing substrate 1102 is fixed on top of the case 1101. Further, the light-emitting device 200, the reflector 1103, and the window cover 1104 are provided on one of surfaces (i.e., mounting surface) of the housing substrate 1102. That is, the spot lighting device 1100 has a configuration similar to the LED light bulb 1000 illustrated in FIG. 32, except for including (i) the reflector 1103 instead of the globe 1003 and (ii) the window cover 1104.

Figure 39:
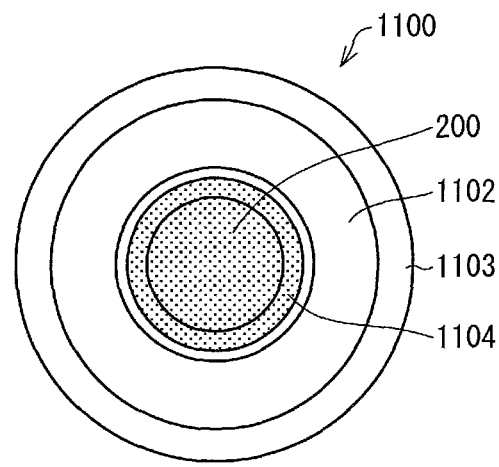
FIG. 39 is a plan view illustrating the spot lighting device.

FIG. 39 is a plan view illustrating the spot lighting device 1100. The reflector 1103 is an optical component provided so as to surround the housing substrate 1102 in order to collect light (see FIG. 39). For example, the reflector 1103 has dimensions in which a part making contact with the housing substrate 1102 has a diameter of 3.8 cm, an opening has a diameter of 8 cm, and a height of the reflector 1103 is 6 cm. A reflecting surface of the reflector 1103 has a curved cross section so that light emitted by the light-emitting device 200 can be collected.

The window cover 1104 is a transparent window which is provided for protecting the light-emitting device 200 and has no light diffusing property. The window cover 1104 is provided so as to cover the light-emitting device 200.

The case 1101 has a lateral surface on which a LAN port 1105 is provided so that a color and/or light can be controlled. Further, a power socket (not illustrated) for four terminals for supplying electric power are provided in the back of the case 1101.

The configuration for supplying electric power and the configuration of the color controlling signal terminals are substantially identical with those of Embodiment 7.

The power source circuit and a color control circuit can be contained in a separate circuit case, instead of being contained in the case 1101. In such a case, the case 1101 and the separate circuit case can be connected with each other via an intermediate case that covers a power source wire which is electrically connected with the light-emitting device 200.

Note that, currently, a spot lighting device of high luminance (i.e., 35 mW class) has been available in which a ceramic metal halide lamp is provided as a light source, a reflector member is provided so as to surround the light source, and a Fresnel lens is provided in an opening of the reflector member for uniformizing light. However, such a spot lighting device cannot control color of light. In a case where the light source is configured by, instead of the ceramic metal halide lamp, a light source device in which (i) a plurality of conventional surface-mounting LEDs, having different emission light colors, are provided on a housing substrate and (ii) the LEDs are covered with a semitransparent cover having a light diffusing property, the light source becomes large in size. Therefore, in a case where only the reflector member is provided, light emitted by the lighting device is to have a luminance distribution.

On the other hand, the spot lighting device 1100 of Embodiment 11 includes, as the light source, the light-emitting device 200 which is remarkably small in size. Therefore, it is possible to reduce a size of the spot lighting device 1100, as compared with the conventional spot lighting device. According to the light-emitting device 200, the first and second fluorescent-substance-containing resin layers, which serve as light source sections having different emission light colors, have respective light-emission centers which substantially conform to each other. Moreover, the light source sections (i.e., the first and second fluorescent-substance-containing resin layers) having different emission light colors are not located away from each other with respect to the reflector 1103 which serves as an optical component for collecting light. According to the configuration, lights emitted from the respective light source sections are not separated by the reflector 1103, and the light is to be emitted from the spot lighting device 1100 as light having a uniform mixed color. Therefore, the spot lighting device 1100 can (i) emit light with a high luminance, (ii) control a color of light, (iii) emit light with a narrow distribution, and (iv) maintain a high mixed color performance of light, without having a light diffusing optical member for uniformizing light. In other words, the first and second fluorescent-substance-containing resin layers, which are the two light source sections having different emission light colors, can be considered as a single pseudo point light source, which is a compact light source that suitably matches the reflector 1103.

According to Embodiment 11, the reflector member is used as an optical component for collecting light. Note, however, that a light collecting lens can be used.

According to Embodiment 11, the light-emitting device 200 of Embodiment 2 is employed as a light source. Note, however, that the light-emitting device of any of the other embodiments can be employed as a light source.

According to Embodiment 11, the light distribution angle of the spot lighting device 1100 can be a smaller angle. That is, the LED lighting device of the present invention can be applied to a spot lighting apparatus whose light distribution angle is, for example, 15° or smaller, while maintaining high quality.

[Overview]

The present invention is not limited to the embodiments, but can be altered by a skilled person in the art within the scope of the claims. An embodiment derived from a proper combination of technical means disclosed in respective different embodiments is also encompassed in the technical scope of the present invention.

As above described, according to the light-emitting device of an embodiment of the present invention, it is preferable that, in each of the plurality of light-emitting sections, the resin layer collectively seals the plurality of light-emitting elements; and a boundary between any adjacent two of the plurality of light-emitting sections is continuously formed so that each of the plurality of light-emitting sections is formed in a spiral pattern when viewed in the direction perpendicular to the upper surface of the substrate.

According to the configuration, it is possible to arrange the plurality of light-emitting sections in an intricate spiral pattern, and it is therefore possible to obtain a remarkably excellent mixed color.

According to the light-emitting device of an embodiment of the present invention, it is preferable that, in each of the plurality of light-emitting sections, the plurality of light-emitting elements are arranged in a spiral pattern when viewed in the direction perpendicular to the upper surface of the substrate.

According to the light-emitting device of an embodiment of the present invention, it is preferable that, in each of the plurality of light-emitting sections, the plurality of light-emitting elements are divided into a plurality of groups each of which includes at least one of the plurality of light-emitting elements, the resin layer being divided into a plurality of resin layers which seal the respective plurality of groups, the resin layers being arranged in the cross section; and a plurality of boundaries, each of which is between any adjacent two of the plurality of light-emitting sections, are formed so as to extend in a direction perpendicular to the cross section, when viewed in the direction perpendicular to the upper surface of the substrate.

According to the configuration, it is possible to arrange the plurality of light-emitting sections in an intricate striped pattern in which stripes of each of the plurality of light-emitting sections alternate with stripes of the other of the plurality of light-emitting sections. This makes it possible to obtain a remarkably excellent mixed color.

According to the light-emitting device of an embodiment of the present invention, it is preferable that the resin layers of the respective plurality of light-emitting sections are directly in contact with each other at the boundary between any adjacent two of the plurality of light-emitting sections.

According to the light-emitting device of an embodiment of the present invention, it is preferable that at least one of the plurality of light-emitting sections includes a resin layer made of a thixotropic resin.

According to the light-emitting device of an embodiment of the present invention, it is preferable that the boundary between any adjacent two of the plurality of light-emitting sections is configured by a resin partition.

The light-emitting device of an embodiment of the present invention preferably further includes a resin frame which is formed on the upper surface of the substrate so as to surround the plurality of light-emitting sections.

According to the light-emitting device of an embodiment of the present invention, it is preferable that the resin frame is colored in white or milk white.

According to the light-emitting device of an embodiment of the present invention, the resin frame contains at least any of a thickener and a diffusing agent.

According to the light-emitting device of an embodiment of the present invention, it is preferable that the boundary between any adjacent two of the plurality of light-emitting sections is configured by a resin partition; a resin frame is formed on the upper surface of the substrate so as to surround the plurality of light-emitting sections; and the resin partition is in contact with the resin frame at two or more locations.

According to the light-emitting device of an embodiment of the present invention, it is preferable that the resin layer of each of the plurality of light-emitting sections contains a fluorescent substance; and at least any of a content and a type of the fluorescent substance is different depending on the plurality of light-emitting sections.

According to the light-emitting device of an embodiment of the present invention, it is preferable that the resin layer of each of the plurality of light-emitting sections is made of any of (i) a light-transmitting resin containing one (1) fluorescent substance, (ii) a light-transmitting resin containing a plurality of fluorescent substances, and (iii) a light-transmitting resin containing no fluorescent substance.

According to the light-emitting device of an embodiment of the present invention, it is preferable that an anode electrode and a cathode electrode for each of the plurality of light-emitting sections are provided on the upper surface of the substrate in an area outside the area in which the plurality of light-emitting sections are formed, the anode electrode and the cathode electrode being electrically connected with the plurality of light-emitting elements provided in a corresponding one of the plurality of light-emitting sections.

According to the light-emitting device of an embodiment of the present invention, it is preferable that at least two of the plurality of cathode electrodes are integrated.

According to the light-emitting device of an embodiment of the present invention, it is preferable that a wiring pattern is formed on the upper surface of the substrate so that the anode electrode and the cathode electrode are electrically connected, via the wiring pattern, with the plurality of light-emitting elements provided in the corresponding one of the plurality of light-emitting sections.

According to the light-emitting device of an embodiment of the present invention, the wiring pattern includes (i) an electrode wiring pattern which is electrically connected with the anode electrode or the cathode electrode and (ii) a relay wiring pattern via which the plurality of light-emitting elements are electrically connected with each other; and the plurality of light-emitting elements provided in the corresponding one of the plurality of light-emitting sections are electrically connected with the anode electrode and the cathode electrode via the electrode wiring pattern and the relay wiring pattern.

The light-emitting device of an embodiment of the present invention preferably further includes at least one protection element which is provided for respective at least one of the plurality of light-emitting sections, each of the at least one protection element being connected in parallel with a plurality of light-emitting elements provided in a corresponding one of the plurality of light-emitting sections.

According to the light-emitting device of an embodiment of the present invention, it is preferable that the substrate is a ceramic substrate which is made of ceramic.

According to the light-emitting device of an embodiment of the present invention, it is preferable that the upper surface of the substrate has a circular shape, a square shape, or a rectangular shape.

According to the light-emitting device of an embodiment of the present invention, it is preferable that a height of the resin partition is smaller than that of the resin frame.

According to the light-emitting device of an embodiment of the present invention, it is preferable that the resin partition has at least one discontinuity.

The lighting device of an embodiment of the present invention preferably further includes an optical member for diffusing light, the optical member being provided so as to cover the light source.

The lighting device of an embodiment of the present invention preferably further includes an optical member for collecting light emitted by the light source.

According to the lighting device of an embodiment of the present invention, it is preferable that the optical member for collecting light emitted by the light source is a reflector member provided so as to surround the light source, the reflector member having a light distribution angle of 35° or smaller.

According to the lighting device of an embodiment of the present invention, it is preferable that the optical member for collecting light emitted by the light source is a light collecting lens provided so as to cover the light source, the light collecting lens having a light distribution angle of 35° or smaller.

According to the light-emitting device of an embodiment of the present invention, it is preferable that a resin layer of at least one of the plurality of light-emitting sections is made of a first resin having a high thixotropy, and a resin layer of at least another one of the plurality of light-emitting sections is made of a second resin whose thixotropy is lower than that of the first resin; and a surface of the resin layer made of the first resin is located higher than a surface of the resin layer made of the second resin.

INDUSTRIAL APPLICABILITY

The present invention can be widely used in fields in relation to (i) a light-emitting device including an LED, (ii) a method for manufacturing the light-emitting device, and (iii) a lighting device including the light-emitting device.

REFERENCE SIGNS LIST

100, 200, 300, 400, 500: Light-emitting device
101: Substrate
102: LED chip (light-emitting element)
104: Printed resistor element (protection element)
105: First resin dam (resin frame)
106: Second resin dam (resin partition)
107: First fluorescent-substance-containing resin layer (resin layer)
108: Second fluorescent-substance-containing resin layer (resin layer)
109: Wiring line (wiring pattern)
109a: Wiring line (wiring pattern, electrode wiring pattern)
109b: Wiring line (wiring pattern, relay wiring pattern)
109c: Wiring line (wiring pattern, relay wiring pattern)
110 through 113: Electrode land (anode electrode, cathode electrode)
114: Bridge electrode
201: First fluorescent-substance-containing resin layer (resin layer)
202: Second fluorescent-substance-containing resin layer (resin layer)
600: Light-emitting device
601: First fluorescent-substance-containing resin layer (resin layer)
602: Second fluorescent-substance-containing resin layer (resin layer)
700: Light-emitting device
706: Low resin dam (resin partition)
800: Light-emitting device
806: Low resin dam (resin partition)
900: Light-emitting device
906: Ring-shaped low resin dam (resin partition)
1000: LED light bulb (lighting device)
1001: Heat sink
1002: Housing substrate
1003: Globe (optical member)
1004: Base
1100: Spot lighting device (lighting device)
1101: Case
1102: Housing substrate
1103: Reflector (optical member, reflector member)
1104: Window cover
1105: LAN port

The invention claimed is:

1. A light-emitting device comprising:
a substrate;
a plurality of light-emitting sections which are adjacently provided on an upper surface of the substrate, and
a resin frame which is formed on the upper surface of the substrate so as to surround the plurality of light-emitting sections,
each of the plurality of light-emitting sections comprising (i) a plurality of light-emitting elements which are electrically connected with each other and (ii) a resin layer which seals the plurality of light-emitting elements,
a first color of light, which is emitted from any one of the plurality of light-emitting sections, being different from a second color of light which is emitted from at least another one of the plurality of light-emitting sections, the any one of the plurality of light-emitting sections being not electrically connected with the at least another one of the plurality of light emitting sections,
in a cross section of said light-emitting device, the resin layer of one of the plurality of light-emitting sections being divided into a plurality of portions by the resin layer of another one of the plurality of light-emitting sections and being in contact with the resin layer of the another one of the plurality of light-emitting sections, the cross section being perpendicular to the upper surface of the substrate and passing through a center of an area of the upper surface in which area the plurality of light-emitting sections are formed, the substrate comprising an anode electrode and a cathode electrode provided thereon for electrically driving the one of the plurality of light-emitting sections, the anode electrode and the cathode electrode corresponding to the one of the plurality of light-emitting sections, the substrate comprising a wiring pattern which is provided on the upper surface of the substrate, the wiring pattern being formed for electrically connecting the anode electrode and the cathode electrode with the plurality of light-emitting elements of the one of the plurality of light-emitting sections, the wiring pattern being covered by the resin frame.

2. The light-emitting device as set forth in claim 1, wherein:

in each of the plurality of light-emitting sections, the resin layer collectively seals the plurality of light-emitting elements; and a boundary between any adjacent two of the plurality of light-emitting sections is continuously formed so that each of the plurality of light-emitting sections is formed in a spiral pattern when viewed in the direction perpendicular to the upper surface of the substrate.

3. The light-emitting device as set forth in claim 1, wherein:

in each of the plurality of light-emitting sections, the plurality of light-emitting elements are divided into a plurality of groups each of which includes at least one of the plurality of light-emitting elements, the resin layer being divided into a plurality of resin layers which seal the respective plurality of groups, the plurality of resin layers being arranged in the cross section; and a plurality of boundaries, each of which is between any adjacent two of the plurality of light-emitting sections, are formed so as to extend in a direction perpendicular to the cross section, when viewed in the direction perpendicular to the upper surface of the substrate.

4. The light-emitting device as set forth in claim 1, wherein:

the resin layers of the respective plurality of light-emitting sections are directly in contact with each other at the boundary between any adjacent two of the plurality of light-emitting sections.

5. The light-emitting device as set forth in claim 4, wherein:

at least one of the plurality of light-emitting sections includes a resin layer made of a thixotropic resin.

6. The light-emitting device as set forth in claim 1, wherein:

the resin layer of each of the plurality of light-emitting sections contains a fluorescent substance; and at least any of a content and a type of the fluorescent substance is different depending on the plurality of light-emitting sections.

7. The light-emitting device as set forth in claim 1, wherein:

the resin layer of each of the plurality of light-emitting sections is made of any of (i) a light-transmitting resin containing one (1) fluorescent substance, (ii) a light-transmitting resin containing a plurality of fluorescent substances, and (iii) a light-transmitting resin containing no fluorescent substance.

8. The light-emitting device as set forth in claim 1, wherein:

the wiring pattern includes (i) an electrode wiring pattern which is electrically connected with the anode electrode or the cathode electrode and (ii) a relay wiring pattern via which the plurality of light-emitting elements are electrically connected with each other; and the plurality of light-emitting elements provided in the corresponding one of the plurality of light-emitting sections are electrically connected with the anode electrode and the cathode electrode via the electrode wiring pattern and the relay wiring pattern.

9. A light-emitting device as set forth in claim 1, further comprising:

at least one protection element which is provided for respective at least one of the plurality of light-emitting sections, each of the at least one protection element being connected in parallel with a plurality of light-emitting elements provided in a corresponding one of the plurality of light-emitting sections.

10. A lighting device comprising, as a light source, a light-emitting device recited in claim 1.

11. The light-emitting device as set forth in claim 1, wherein the anode electrode and the cathode electrode are provided at corners of the upper surface of the substrate.

12. The light-emitting device as set forth in claim 1 wherein the boundary between any adjacent two of the plurality of light-emitting sections is configured by a resin partition.

13. A light-emitting device as set forth in claim 12, further comprising:

a height of the resin partition being smaller than that of the resin frame.

14. A light-emitting device as set forth in claim 1, wherein:

(i) a light emitting section constituting the resin layer of the one of the plurality of light-emitting sections and (ii) a light emitting section constituting the resin layer of the another one of the plurality of light-emitting sections emit different color of light and are not electrically connected with each other.

15. A light-emitting device comprising:

a plurality of light-emitting sections which are adjacently provided on an upper surface of the substrate, each of the plurality of light-emitting sections comprising (i) a plurality of light-emitting elements which are electrically connected with each other and (ii) a resin layer which seals the plurality of light-emitting elements, a first color of light, which is emitted from any one of the plurality of light-emitting sections, being different from a second color of light which is emitted from at least another one of the plurality of light emitting sections, the any one of the plurality of light-emitting sections being not electrically connected with the at least another one of the plurality of light emitting sections, in a cross section of said light emitting device, the resin layer of one of the plurality of light-emitting sections being divided into a plurality of portions by the resin layer of another one of the plurality of light-emitting sections and being in contact with the resin layer of the another one of the plurality of light-emitting sections, the cross section being perpendicular to the upper surface of the substrate and passing through a center of an area of the upper surface in which area the plurality of light-emitting sections are formed, a resin layer of at least one of the plurality of light-emitting sections comprising a first resin having a high thixotropy, and a resin layer of at least another one of the plurality of light-emitting sections comprising a second resin whose thixotropy is lower than that of the first resin, a surface of the resin layer made of the first resin being located higher than a surface of the resin layer made of the second resin.

16. A lighting device comprising, as a light source, the light-emitting device recited in claim 15.

17. A light-emitting device as set forth in claim 15, wherein:
(i) a light emitting section constituting the resin layer of the one of the plurality of light-emitting sections and
(ii) a light emitting section constituting the resin layer of the another one of the plurality of light-emitting sections emit different color of light and are not electrically connected with each other.

* * * * *